United States Patent
Komai

(10) Patent No.: US 10,558,397 B2
(45) Date of Patent: Feb. 11, 2020

(54) SEMICONDUCTOR STORAGE DEVICE

(71) Applicant: TOSHIBA MEMORY CORPORATION, Tokyo (JP)

(72) Inventor: Hiromitsu Komai, Kamakura Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/905,827

(22) Filed: Feb. 27, 2018

(65) Prior Publication Data

US 2019/0050169 A1 Feb. 14, 2019

(30) Foreign Application Priority Data

Aug. 14, 2017 (JP) .................. 2017-156530

(51) Int. Cl.
  *G06F 3/06* (2006.01)
  *G11C 16/24* (2006.01)
  (Continued)

(52) U.S. Cl.
  CPC ............. *G06F 3/0679* (2013.01); *G11C 7/08* (2013.01); *G11C 7/1006* (2013.01); *G11C 7/18* (2013.01);
  (Continued)

(58) Field of Classification Search
  CPC ........... G11C 7/08; G11C 7/1006; G11C 7/18; G11C 16/0466; G11C 16/08; G11C 16/10;
  (Continued)

(56) References Cited

U.S. PATENT DOCUMENTS 5,815,444 A 9/1998 Ohta
6,891,753 B2 * 5/2005 Cernea ................ G11C 7/1006
                                                    365/185.03
(Continued)

FOREIGN PATENT DOCUMENTS

JP       3897388 B2    3/2007
JP    2009-141222 A    6/2009
(Continued)

OTHER PUBLICATIONS

Taiwanese Office Action dated Nov. 22, 2018 in related Taiwanese Patent Application 106146448, 6 pages.

*Primary Examiner* — Sung Il Cho
(74) *Attorney, Agent, or Firm* — Kim & Stewart LLP

(57) ABSTRACT

A semiconductor storage device includes a hookup circuit including first and second circuits connected respectively to first and second bit lines, a first circuit group including a first sense amplifier circuit connected to the first circuit and a first data register connected to the first sense amplifier circuit, a second circuit group including a second sense amplifier circuit connected to the second circuit and a second data register connected to the second sense amplifier circuit, and a memory cell array that is above the hookup circuit and the first and second circuit groups and includes a first memory cell connected to the first bit line and a second memory cell connected to the second bit line. The first circuit group, the hookup circuit, and the second circuit group are arranged in sequence along a first direction that is parallel to a surface of the semiconductor substrate.

11 Claims, 16 Drawing Sheets

(51) Int. Cl.

| | | |
|---|---|---|
| *G11C 16/26* | (2006.01) | |
| *G11C 7/10* | (2006.01) | |
| *G11C 7/18* | (2006.01) | |
| *G11C 7/08* | (2006.01) | |
| *H01L 27/11573* | (2017.01) | |
| *H01L 27/1157* | (2017.01) | |
| *G11C 16/04* | (2006.01) | |
| G11C 16/08 | (2006.01) | |
| G11C 16/10 | (2006.01) | |

(52) U.S. Cl.
CPC .......... *G11C 16/0466* (2013.01); *G11C 16/24* (2013.01); *G11C 16/26* (2013.01); *H01L 27/1157* (2013.01); *H01L 27/11573* (2013.01); *G11C 16/08* (2013.01); *G11C 16/10* (2013.01); *G11C 2207/002* (2013.01)

(58) Field of Classification Search
CPC ... G11C 2207/002; G11C 16/24; G11C 16/26; G06F 3/0679; H01L 27/1157; H01L 27/11573
USPC .......................................................... 365/72
See application file for complete search history.

(56) References Cited

U.S. PATENT DOCUMENTS

| | | | |
|---|---|---|---|
| 7,310,262 B2 | 12/2007 | Nishihara et al. | |
| 7,327,619 B2* | 2/2008 | Chan .................. | G11C 7/062 365/185.21 |
| 7,623,384 B2* | 11/2009 | Iwata .................. | G11C 8/10 365/185.03 |
| 7,675,783 B2 | 3/2010 | Park et al. | |
| 7,817,476 B2* | 10/2010 | Cernea ................ | G11C 11/5642 365/185.11 |
| 8,243,491 B2 | 8/2012 | Hisada et al. | |
| 9,703,719 B2* | 7/2017 | Balakrishnan ...... | G06F 12/0895 |
| 2011/0176347 A1* | 7/2011 | Hisada ................ | G11C 7/18 365/72 |
| 2011/0249482 A1* | 10/2011 | Funayama .......... | G11C 16/0483 365/63 |
| 2012/0014164 A1* | 1/2012 | Kamoshida ........ | G11C 13/0004 365/148 |
| 2012/0063224 A1* | 3/2012 | Edahiro .............. | G11C 11/5628 365/185.03 |
| 2012/0250425 A1* | 10/2012 | Yoshihara .......... | G11C 7/08 365/189.05 |
| 2013/0270568 A1* | 10/2013 | Rabkin ............... | H01L 29/6675 257/66 |
| 2014/0043902 A1* | 2/2014 | Unno .................. | G11C 16/28 365/185.03 |
| 2014/0071763 A1* | 3/2014 | Shikata .............. | G11C 16/0483 365/185.18 |
| 2014/0140124 A1* | 5/2014 | Kang .................. | G11C 13/004 365/148 |
| 2014/0192598 A1* | 7/2014 | He ..................... | G11C 16/0483 365/185.17 |
| 2014/0241057 A1* | 8/2014 | Funatsuki ........... | G11C 16/102 365/185.03 |
| 2014/0346677 A1* | 11/2014 | Sonoda .............. | H01L 21/76838 257/774 |
| 2015/0069377 A1* | 3/2015 | Rabkin ............... | H01L 27/1225 257/43 |
| 2016/0035396 A1* | 2/2016 | Naito .................. | G11O 5/063 257/773 |
| 2016/0056067 A1* | 2/2016 | Endo .................. | H01L 21/7682 257/776 |
| 2016/0078953 A1 | 3/2016 | Bushnaq et al. | |

FOREIGN PATENT DOCUMENTS

| | | |
|---|---|---|
| JP | 2011-151150 A | 8/2011 |
| TW | 200403690 A | 3/2004 |
| TW | 201611001 A | 3/2016 |
| TW | 201633295 A | 9/2016 |
| TW | 201643883 A | 12/2016 |

\* cited by examiner

SEMICONDUCTOR STORAGE DEVICE

CROSS-REFERENCE TO RELATED APPLICATION

This application is based upon and claims the benefit of priority from Japanese Patent Application No. 2017-156530, filed Aug. 14, 2017, the entire contents of which are incorporated herein by reference.

FIELD

Embodiments described herein relate generally to a semiconductor storage device.

BACKGROUND

NAND flash memories are known as semiconductor storage devices.

DETAILED DESCRIPTION

Figure 1:
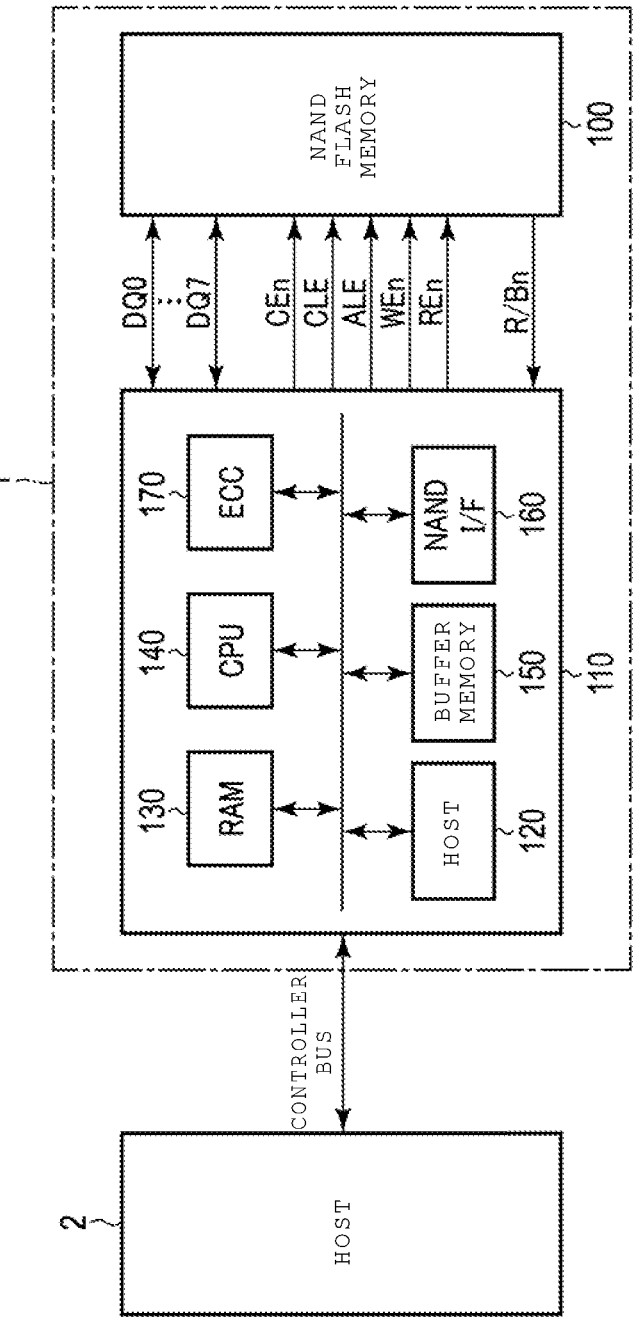
FIG. 1 is a block diagram illustrating a memory system including a semiconductor storage device according to a first embodiment.

In general, according to one embodiment, a semiconductor storage device includes a hookup circuit that is above a semiconductor substrate and includes a first circuit connected to a first bit line and a second circuit connected to a second bit line, a first circuit group that includes a first sense amplifier circuit connected to the first circuit and a first data register connected to the first sense amplifier circuit via a first data bus, a second circuit group that includes a second sense amplifier circuit connected to the second circuit and a second data register connected to the second sense amplifier circuit via a second data bus, and a memory cell array that is above the hookup circuit and the first and second circuit groups and includes a first memory cell connected to the first bit line and a second memory cell connected to the second bit line. The first circuit group, the hookup circuit, and the second circuit group are arranged in sequence along a first direction that is parallel to a surface of the semiconductor substrate.

Hereinafter, embodiments will be described with reference to the drawings. In the description, common reference numerals are given to common portions throughout the drawings.

1. First Embodiment

A semiconductor storage device according to a first embodiment will be described. Hereinafter, a 3-dimensional stacked NAND flash memory in which memory cell transistors are 3-dimensionally stacked above a semiconductor substrate will be set forth as a semiconductor storage device.

1.1 Configuration 1.1.1 Overall Configuration of Memory System

First, a configuration of a memory system including the semiconductor storage device according to the embodiment will be described with reference to FIG. 1.

As illustrated in FIG. 1, a memory system 1 includes a NAND flash memory 100 and a controller 110. The controller 110 and the NAND flash memory 100 may be combined in this way to configure one semiconductor storage device e.g., a memory card such as an SDTM card, or a solid-state drive (SSD).

The NAND flash memory 100 includes a plurality of memory cell transistors and stores data in a nonvolatile manner. The NAND flash memory 100 is connected to the controller 110 via a NAND bus and operates based on commands from the controller 110. More specifically, the NAND flash memory 100 transmits and receives, for example, 8-bit signals DQ0 to DQ7 (hereinafter simply referred to as signals DQ or signals DQ [7: 0] when DQ0 to DQ7 are not specified) to and from the controller 110. The signals DQ0 to DQ7 include, for example, data, addresses, and commands. The NAND flash memory 100 receives, for example, a chip enable signal CEn, a command latch enable signal CLE, an address latch enable signal ALE, a write enable signal WEn, and a read enable signal REn from the controller 110. Then, the NAND flash memory 100 transmits a ready/busy signal R/Bn to the controller 110.

The chip enable signal CEn is a signal for enabling the NAND flash memory 100 and is asserted at, for example, a low ("L") level. The command latch enable signal CLE is a signal indicating that the signal DQ is a command and is asserted at, for example, a high ("H") level. The address latch enable signal ALE is a signal indicating that the signal DQ is an address and is asserted at, for example, the "H" level. The write enable signal WEn is a signal for taking a received signal in the NAND flash memory 100 and is asserted at, for example, the "L" level when a command, an address, data, or the like is received from the controller 110. Accordingly, a signal DQ is taken in the NAND flash memory 100 when WEn is toggled. The read enable signal REn is a signal used for the controller 110 to read data from the NAND flash memory 100. The read enable signal REn is asserted at, for example, the "L" level. The ready/busy signal R/Bn is a signal indicating whether the NAND flash memory 100 is in a busy state or a ready state, (in other words, a state in which a command is not receivable or receivable from the controller 110) and is considered to be at the "L" level, for example, when the NAND flash memory 100 is in the busy state.

The controller 110 gives a read command, a write command, an erasing command, or the like for data to the NAND flash memory 100 in response to a command from a host device 2. The controller 110 manages a memory space of the NAND flash memory 100.

The controller 110 includes a host interface circuit 120, an internal memory (RAM) 130, a processor (CPU) 140, a buffer memory 150, a NAND interface circuit 160, and an ECC circuit 170.

The host interface circuit 120 is connected to the host device 2 via a controller bus and governs communication with the host device 2. The host interface circuit 120 transmits commands and data received from the host device 2 to the processor 140 and the buffer memory 150. The host interface circuit 120 transmits data in the buffer memory 150 to the host device 2 in response to a command of the processor 140.

The NAND interface circuit 160 is connected to the NAND flash memory 100 via the NAND bus and governs communication with the NAND flash memory 100. The NAND interface circuit 160 transmits a command received from the processor 140 to the NAND flash memory 100. The NAND interface circuit 160 transmits write data in the buffer memory 150 to the NAND flash memory 100 at the time of writing. Further, the NAND interface circuit 160 transmits data read from the NAND flash memory 100 to the buffer memory 150 at the time of reading.

The processor 140 controls an operation of the entire controller 110. The processor 140 issues various commands in response to commands of the host device 2 to transmit commands to the NAND flash memory 100. For example, when a write command is received from the host device 2, the processor 140 transmits a write command to the NAND flash memory 100 in response to the write command. The same applies to the time of reading and the time of erasing. The processor 140 executes various processes such as wear leveling to manage the NAND flash memory 100. Further, the processor 140 executes various operations. For example, the processor 140 executes a data encryption process or a randomization process.

The buffer memory 150 retains the write data received from the host device 2 and the read data received from the NAND flash memory 100.

The ECC circuit 170 executes an error checking and correcting (ECC) process on data.

The internal memory 130 is, for example, a semiconductor memory such as a DRAM and is used as a working area of the processor 140. The internal memory 130 retains firmware or various management tables used to manage the NAND flash memory 100.

1.1.2 Configuration of Semiconductor Storage Device

Figure 2:
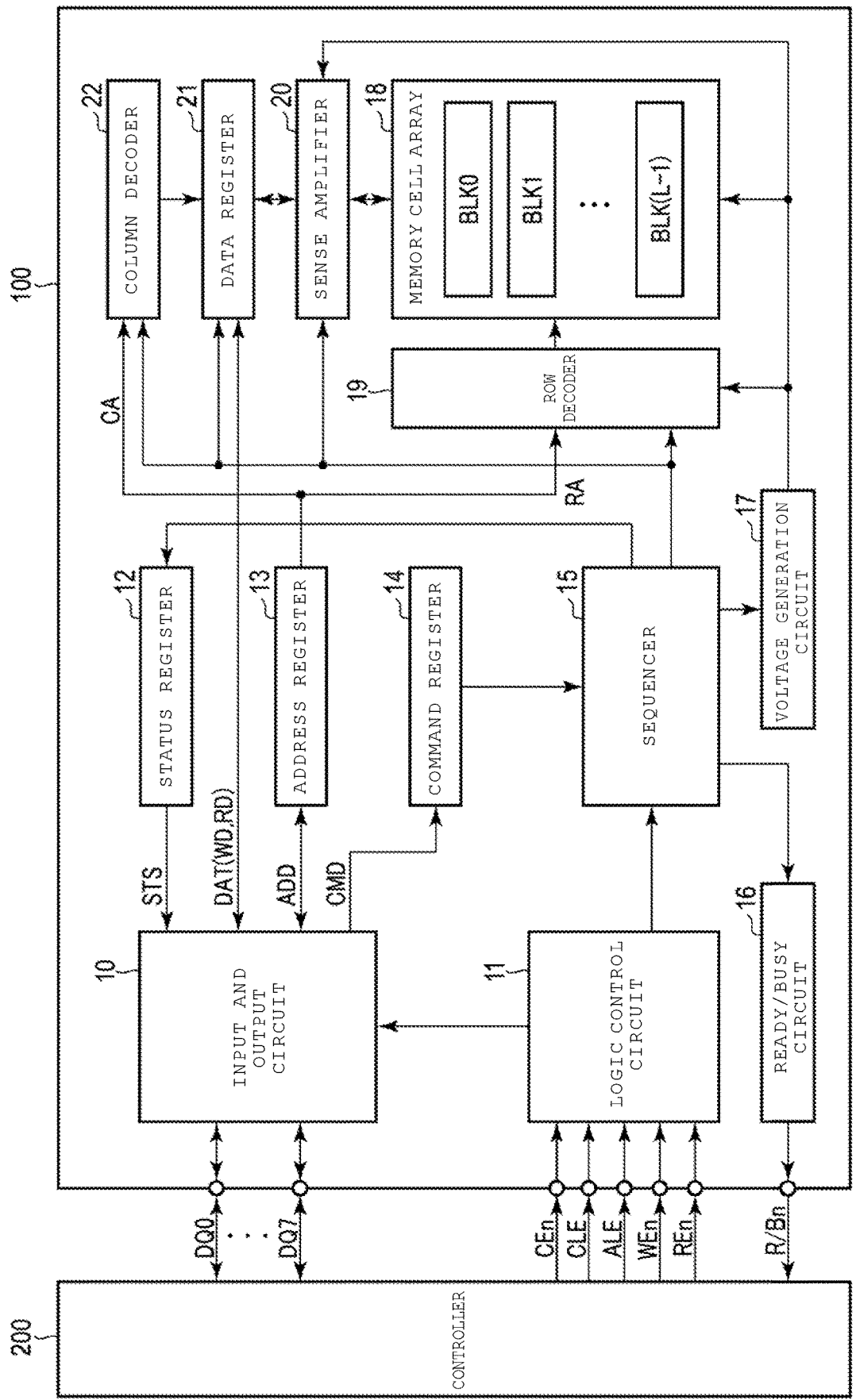
FIG. 2 is a block diagram illustrating the semiconductor storage device according to the first embodiment.

Next, the configuration of the semiconductor storage device will be described with reference to FIG. 2. In FIG. 2, a part of connection between blocks is indicated by arrows, but the connection between the blocks is not limited thereto.

As illustrated in FIG. 2, the NAND flash memory 100 includes an input and output circuit 10, a logic control circuit 11, a status register 12, an address register 13, a command register 14, a sequencer 15, a ready/busy circuit 16, a voltage generation circuit 17, a memory cell array 18, a row decoder 19, a sense amplifier 20, a data register 21, and a column decoder 22.

The input and output circuit 10 transmits and receives the 8-bit signal DQ0 to DQ7 to and from the controller 110. More specifically, the input and output circuit 10 includes an input circuit and an output circuit. The input circuit transmits data DAT (write data WD) received from the controller 110 to the data register 21, transmits an address ADD to the address register 13, and transmits a command CMD to the command register 14. The output circuit transmits status information STS received from the status register 12, data DAT (read data RD) received from the data register 21, and the address ADD received from the address register 13 to the controller 110.

The logic control circuit 11 receives, for example, the chip enable signal CEn, the command latch enable signal CLE, the address latch enable signal ALE, the write enable signal WEn, and the read enable signal REn from the controller 110. Then, the logic control circuit 11 controls the input and output circuit 10 and the sequencer 15 in accordance with a received signal.

The status register 12 temporarily retains the status information STS, for example, in a write operation, a read operation, and an erasing operation for data and notifies the controller 110 whether the operation normally ends.

The address register 13 temporarily retains the address ADD received from the controller 110 via the input and output circuit 10. Then, the address register 13 transmits a row address RA to the row decoder 19 and transmits a column address CA to the column decoder 22.

The command register 14 temporarily stores the command CMD received from the controller 110 via the input and output circuit 10 and transmits the command CMD to the sequencer 15.

The sequencer 15 controls an operation of the entire NAND flash memory 100. More specifically, the sequencer 15 controls, for example, the status register 12, the ready/busy circuit 16, the voltage generation circuit 17, the row decoder 19, the sense amplifier 20, the data register 21, the column decoder 22, and the like according to the command CMD retained by the command register 14 to execute the write operation, the read operation, and the erasing operation.

The ready/busy circuit 16 transmits the ready/busy signal R/Bn to the controller 110 according to an operation situation of the sequencer 15.

The voltage generation circuit 17 generates a voltage necessary for a write operation, a read operation, and an erasing operation according to control of the sequencer 15 and supplies the generated voltage, for example, to the memory cell array 18, the row decoder 19, and the sense amplifier 20. The row decoder 19 and the sense amplifier 20 apply a voltage supplied from the voltage generation circuit 17 to memory cell transistors in the memory cell array 18.

The memory cell array 18 includes a plurality of blocks BLK (BLK0, BLK1, . . . , and BLK(L−1)) (where L is an integer equal to or greater than 2) including nonvolatile memory cell transistors (hereinafter also referred to as "memory cells") associated with rows and columns. Each block BLK includes a plurality of string units SU (SU0, SU1, SU2, SU3, . . . ). Each string unit SU includes a plurality of NAND strings SR. The number of blocks BLK in the memory cell array 18 and the number of string units SU in the block BLK may be any number. The details of the memory cell array 18 will be described below.

The row decoder 19 decodes the row address RA. The row decoder 19 selects any block BLK and further selects a string unit SU based on a decoding result. Then, the row decoder 19 applies a necessary voltage to the block BLK.

The sense amplifier 20 senses data read from the memory cell array 18 in a read operation. Then, the sense amplifier 20 transmits the read data RD to the data register 21. The sense amplifier 20 transmits the write data WD to the memory cell array 18 in a write operation.

The data register 21 includes a plurality of latch circuits. The latch circuit retains the write data WD and the read data RD. For example, in a write operation, the data register 21 temporarily retains the write data WD received from the input and output circuit 10 and transmits the write data WD to the sense amplifier 20. For example, in a read operation, the data register 21 temporarily retains the read data RD received from the sense amplifier 20 and transmits the read data RD to the input and output circuit 10.

The column decoder 22 decodes the column address CA in, for example, a write operation, a read operation, and an erasing operation and selects a latch circuit in the data register 21 according to a decoding result.

1.1.3 Configuration of Memory Cell Array

Figure 3:
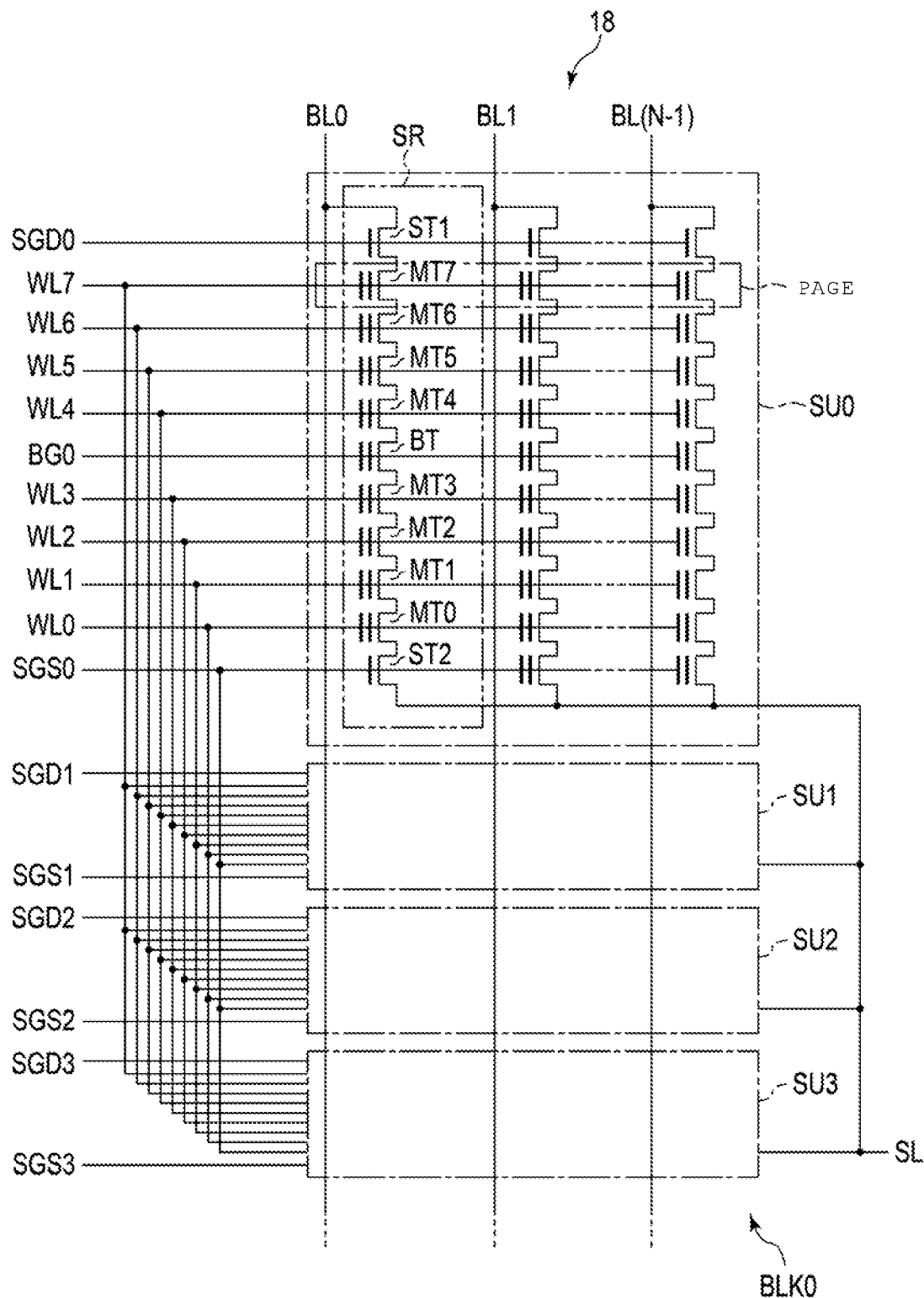
FIG. 3 is a circuit diagram illustrating a memory cell array provided in the semiconductor storage device according to the first embodiment.

Next, the configuration of the memory cell array 18 will be described with reference to FIG. 3. FIG. 3 is a circuit diagram illustrating the block BLK0. The blocks BLK1 to BLK3 have the same configuration.

As illustrated in FIG. 3, the block BLK0 includes, for example, four string units SU. Each string unit SU includes N (where N is a natural number) NAND strings SR.

Each NAND string SR includes, for example, 8 memory cell transistors MT (MT0 to MT7), select transistors ST1 and ST2, and a back-gate transistor BT. The memory cell transistor MT includes a stacked gate including a control gate and a charge storage layer and retains data in a nonvolatile manner. The number of memory cell transistors MT is not limited to 8, and may be 16, 32, 64, or 128. The number of memory cell transistors MT is not limited. The back-gate transistor BT includes a stacked gate including a control gate and a charge storage layer as in the memory cell transistor MT. However, the back-gate transistor BT does not retain data, but functions as a simply current path at the time of data writing and erasing. The memory cell transistors MT and the back-gate transistor BT are laid out so that the current paths are connected in series between the select transistors ST1 and ST2. The back-gate transistor BT is installed between the memory cell transistors MT3 and MT4. The current path of the memory cell transistor MT7 on one end side of the series connection is connected to one end of the current path of the select transistor ST1 and the current path of the memory cell transistor MT0 on the other end side of the series connection is connected to one end of the current path of the select transistor ST2.

The gate of the select transistor ST1 of each of the string units SU0 to SU3 is connected to corresponding select gate lines SGD0 to SGD3. The gate of the select transistor ST2 of each of the string units SU0 to SU3 is connected to corresponding select gate lines SGS0 to SGS3. The control gates of the memory cell transistors MT0 to MT7 in the same block BLK0 are respectively connected in common to word lines WL0 to WL7 and the control gate of the back-gate transistor BT is connected in common to back gate lines BG (BG0 to BG3 in the blocks BLK0 to BLK3).

That is, while the word lines WL0 to WL7 and the back-gate line BG are connected in common across the plurality of string units SU0 to SU3 in the same block BLK0, the select gate lines SGD and SGS are independent in each of the string units SU0 to SU3 even in the same blocks BLK0.

Of the NAND strings SR laid out in a matrix configuration in the memory cell array 18, the other end of the current path of the select transistor ST1 of the NAND string SR at the same row is connected in common to one of the bit lines BL (BL0 to BL(N−1)). That is, the bit lines BL connect the NAND strings SR in common between the plurality of blocks BLK. The other end of the current path of the select transistor ST2 is connected in common to a source line SL. The source line SL connects the NAND strings SR in common between, for example, the plurality of blocks.

Data reading and writing are executed together on the plurality of memory cell transistors MT connected in common to one word line WL in one string unit SU of one block BLK. This unit is referred to as a "page".

Figure 4:
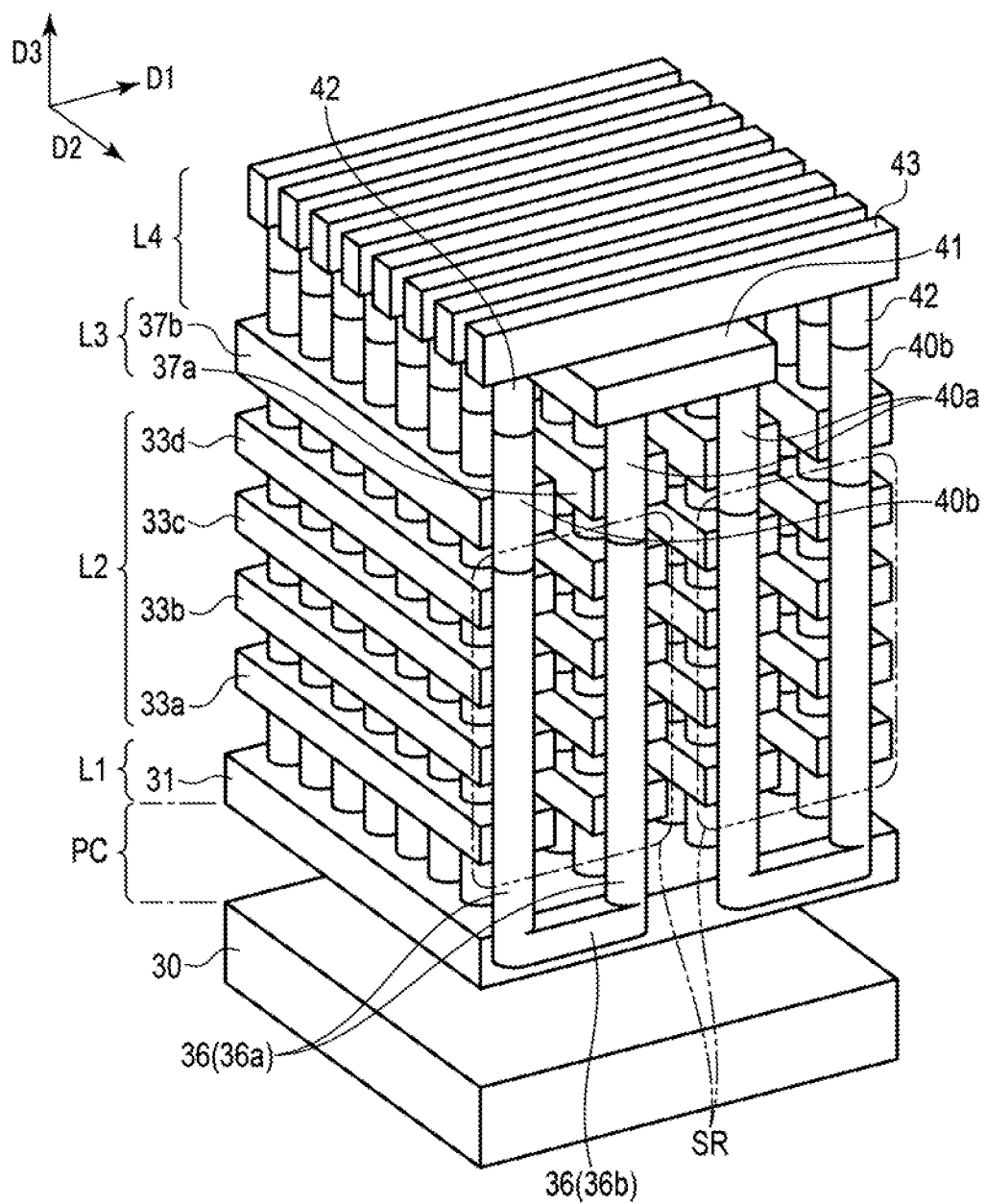
FIG. 4 is a perspective view illustrating the memory cell array provided in the semiconductor storage device according to the first embodiment.
Figure 5:
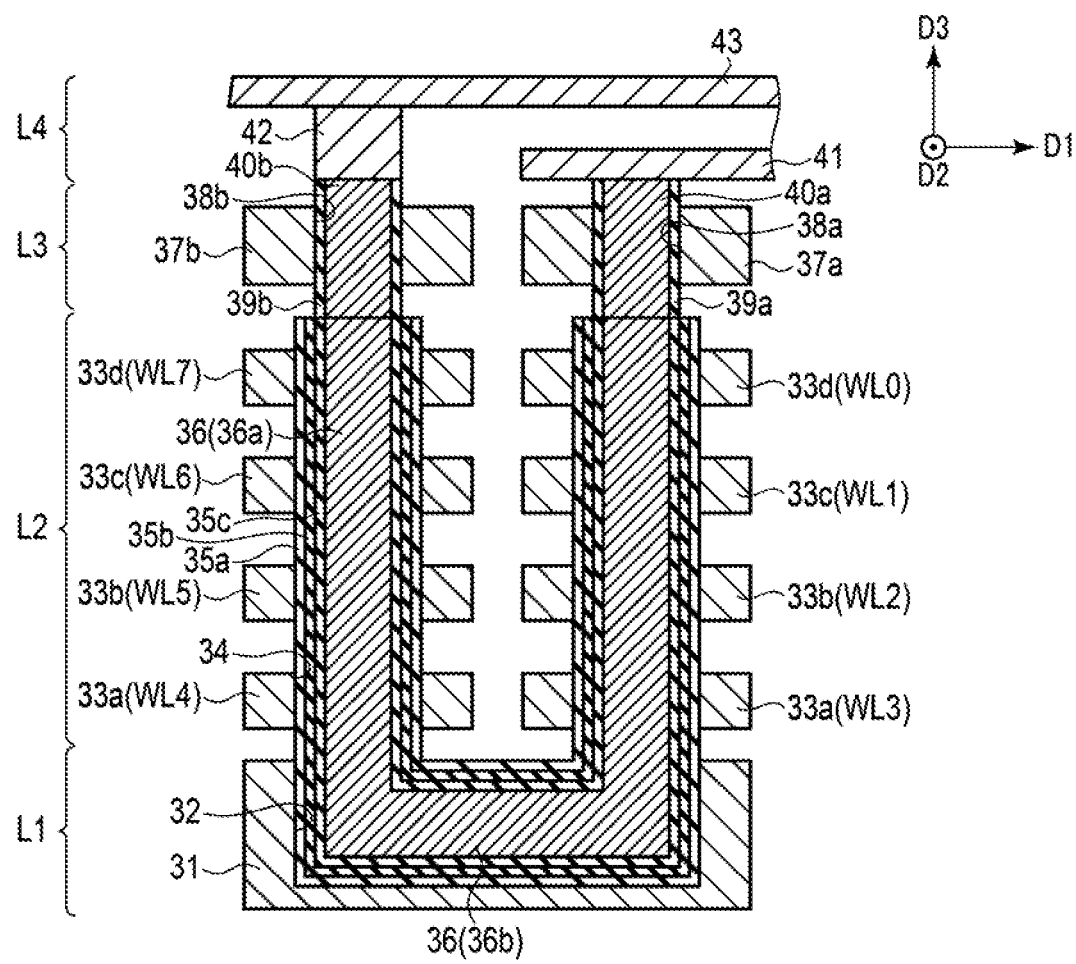
FIG. 5 is a sectional view illustrating the memory cell array provided in the semiconductor storage device according to the first embodiment.

Next, a 3-dimensional stacked structure of the memory cell array 18 will be described with reference to FIGS. 4 and 5. In the example of FIGS. 4 and 5, interlayer insulating films are omitted. Further, in the example of FIG. 4, peripheral circuits, for example, a BL hookup circuit BHU, the sense amplifier 20, and the data register 21, installed below the memory cell array 18 are omitted.

As illustrated in FIG. 4, the memory cell array 18 is above a peripheral circuit region PC, which is above a semiconductor substrate 30. The memory cell array 18 includes aback-gate transistor layer L1, a memory cell transistor layer L2, a select transistor layer L3, and a wiring layer L4 formed in sequence above the peripheral circuit region PC via interlayer insulating films.

The back-gate transistor layer L1 includes the back-gate transistor BT. The memory cell transistor layer L2 includes the memory cell transistors MT0 to MT7 (which make up NAND strings SR). The select transistor layer L3 includes the select transistors ST1 and ST2. The wiring layer L4 includes the source line SL and the bit line BL.

The back-gate transistor layer L1 includes a back-gate conductive layer 31. The back-gate conductive layer 31 is formed to spread 2-dimensionally in a first direction D1 and a second direction D2 parallel to the semiconductor substrate 30. The first direction D1 and the second direction D2 are orthogonal to a third direction D3 in which the memory cell transistors MT are stacked. The back-gate conductive layer 31 is segmented for each block BLK. The back-gate conductive layer 31 is made of, for example, polycrystalline silicon. The back-gate conductive layer 31 includes the back-gate line BG.

The back-gate conductive layer 31 has a back-gate hole 32, as illustrated in FIG. 5. The back-gate hole 32 is formed into the back-gate conductive layer 31. The back-gate hole 32 is formed in a substantially rectangular shape in which the long side of the substantially rectangular shape extends along the first direction D1.

The memory cell transistor layer L2 is formed in an upper layer of the back-gate transistor layer L1. The memory cell transistor layer L2 includes word lines conductive layers 33a to 33d. The word lines conductive layers 33a to 33d are stacked via interlayer insulating films (not illustrated). The word lines conductive layers 33a to 33d are formed in a stripe shape extending in the second direction D2. The word lines conductive layers 33a to 33d are made of, for example, polycrystalline silicon. The word line conductive layer 33a functions as a control gate (the word line WL3 or WL4) of the memory cell transistor MT3 or MT4. The word line conductive layer 33b functions as a control gate (the word line WL2 or WL5) of the memory cell transistor MT2 or MT5. The word line conductive layer 33c functions as a control gate (the word line WL1 or WL6) of the memory cell transistor MT1 or MT6. The word line conductive layer 33d functions as a control gate (the word line WL0 or WL7) of the memory cell transistor MT0 or MT7.

The memory cell transistor layer L2 has a memory hole 34, as illustrated in FIG. 5. The memory hole 34 is formed to penetrate through the word line conductive layers 33a to 33d. The memory hole 34 is formed to match the vicinity of an end of the back-gate hole 32 in the first direction D1.

The back-gate transistor layer L1 and the memory cell transistor layer L2 include a block insulating layer 35a, a charge storage layer 35b, a tunnel insulating layer 35c, and a semiconductor layer 36, as illustrated in FIG. 5. The semiconductor layer 36 functions as a current path (a back-gate of each transistor) of the NAND string SR.

As illustrated in FIG. 5, the block insulating layer 35a is formed to come into contact with the back-gate hole 32 and the memory hole 34. The charge storage layer 35b is formed to come into contact with the block insulating layer 35a. The tunnel insulating layer 35c is formed to come into contact with the charge storage layer 35b. The semiconductor layer 36 is formed to come into contact with the tunnel insulating layer 35c. The semiconductor layer 36 is formed to fill the back-gate hole 32 and the memory hole 34.

The semiconductor layer 36 is formed in a U shape when viewed in the second direction D2. That is, the semiconductor layer 36 includes a pair of columnar-shaped portions 36a extending in the vertical direction of the surface of the semiconductor substrate 30 and a connecting portion 36b connecting lower ends of the pair of columnar-shaped portions 36a.

The block insulating layer 35a and the tunnel insulating layer 35c are made of, for example, oxide silicon (SiO2). The charge storage layer 35b is made of, for example, nitride silicon (SiN). The semiconductor layer 36 is made of, for example, polycrystalline silicon. The block insulating layer 35a, the charge storage layer 35b, the tunnel insulating layer 35c, and the semiconductor layer 36 form MONOS transistors that function as the memory cell transistors MT.

In the configuration of the back-gate transistor layer L1, in other words, the tunnel insulating layer 35c is formed to surround the connecting portion 36b. The charge storage layer 35b is formed to surround the tunnel insulating layer 35c. The block insulating layer 35a is formed to surround the charge storage layer 35b. The back-gate conductive layer 31 is formed to surround the block insulating layer 35a, the charge storage layer 35b, the tunnel insulating layer 35c, and the connecting portion 36b.

In the configuration of the memory cell transistor layer L2, in other words, the tunnel insulating layer 35c is formed to surround the columnar-shaped portions 36a. The charge storage layer 35b is formed to surround the tunnel insulating layer 35c. The block insulating layer 35a is formed to surround the charge storage layer 35b. The word lines conductive layers 33a to 33d are formed to surround the block insulating layer 35a, the charge storage layer 35b, the tunnel insulating layer 35c, and the columnar-shaped portions 36a.

The select transistor layer L3 includes conductive layers 37a and 37b, as illustrated in FIGS. 4 and 5. The conductive layers 37a and 37b extend in the second direction D2. The conductive layer 37a is formed in an upper layer of one columnar-shaped portion 36a and the conductive layer 37b is formed in an upper layer of the other columnar-shaped portion 36a.

The conductive layers 37a and 37b are made of, for example, polycrystalline silicon. The conductive layer 37a functions as a gate of the select transistor ST2 and the conductive layer 37b functions as a gate of the select transistor ST1.

The select transistor layer L3 has holes 38a and 38b, as illustrated in FIG. 5. The holes 38a and 38b penetrate through the conductive layers 37a and 37b, respectively. The holes 38a and 38b match the memory holes 34, respectively.

The select transistor layer L3 includes gate insulating layers 39a and 39b and semiconductor layers 40a and 40b, as illustrated in FIG. 5. The gate insulating layers 39a and 39b are formed to come into contact with the holes 38a and 38b, respectively. The semiconductor layers 40a and 40b are formed in a columnar shape extending in the vertical direction of the surface of the semiconductor substrate 30 to come into contact with the gate insulating layers 39a and 39b, respectively.

The gate insulating layers 39a and 39b are made of, for example, oxide silicon (SiO2). The semiconductor layers 40a and 40b are made of, for example, polycrystalline silicon.

In the configuration of the select transistor layer L3, in other words, the gate insulating layer 39a is formed to surround the columnar-shaped semiconductor layer 40a. The conductive layer 37a is formed to surround the gate insulating layer 39a and the semiconductor layer 40a. The gate insulating layer 39b is formed to surround the columnar-shaped semiconductor layer 40b. The conductive layer 37b is formed to surround the gate insulating layer 39b and the semiconductor layer 40b.

The wiring layer L4 is formed in an upper layer of the select transistor layer L3, as illustrated in FIGS. 4 and 5. The wiring layer L4 includes a source line layer 41, a plug layer 42, and a bit line layer 43.

The source line layer 41 extends in the second direction D2. The source line layer 41 is formed to come into contact with the upper surface of the semiconductor layer 40a. The plug layer 42 extends in the third direction D3 to come into contact with the upper surface of the semiconductor layer 40b. The bit line layer 43 extends in the first direction D1. The bit line layer 43 is formed to come into contact with the upper surface of the plug layer 42. The source line layer 41, the plug layer 42, and the bit line layer 43 are made of, for example, metal such as tungsten (W). The source line layer 41 functions as the source line SL and the bit line layer 43 functions as the bit line BL.

The configuration of the memory cell array 18 may have another configuration. For example, the NAND string SR may not have the U shape, but may have one columnar shape. The configuration of the memory cell array 18 may be as disclosed in, for example, U.S. patent application Ser. No. 12/407,403, filed on 19 Mar. 2009 and entitled "THREE DIMENSIONAL STACKED NONVOLATILE SEMICONDUCTOR MEMORY," U.S. patent application Ser. No. 12/406,524, filed on 18 Mar. 2009 and entitled "THREE DIMENSIONAL STACKED NONVOLATILE SEMICONDUCTOR MEMORY," U.S. patent application Ser. No. 12/679,991, filed on 25 Mar. 2010 and entitled "NONVOLATILE SEMICONDUCTOR STORAGE DEVICE AND METHOD OF MANUFACTURING THE SAME," and U.S. patent application Ser. No. 12/532,030, filed on 23 Mar. 2009 and entitled "SEMICONDUCTOR MEMORY AND METHOD FOR MANUFACTURING SAME." The entire contents of these patent applications are incorporated herein by reference.

1.1.4 Configurations of Sense Amplifier and Data Register

Next, the configurations of the sense amplifier 20 and the data register 21 will be described with reference to FIG. 6.

The sense amplifier 20 includes sense amplifier units SAU (SAU0 to SAU(N−1)) corresponding to the bit lines BL (BL0 to BL(N−1)). The example of FIG. 6 is a circuit diagram of the sense amplifier unit SAU corresponding to one bit line BL.

The data register 21 includes a plurality of latch circuits XDL corresponding to the sense amplifier units SAU. The latch circuit XDL temporarily retains the read data RD received from the sense amplifier unit SAU and the write data WD received from the input and output circuit 10. More specifically, the write data WD received by the input and output circuit 10 is transmitted to the sense amplifier unit SAU via the latch circuit XDL. The read data RD received from the sense amplifier unit SAU is transmitted to the input and output circuit 10 via the latch circuit XDL.

In the embodiment, the sense amplifier unit SAU of a current sense scheme, which senses a current flowing in the bit line BL, will be described as an example, but the sense amplifier unit SAU of a voltage sense scheme may be used. In the following description, one of the source and the drain of a transistor is referred to as an "one end of the transistor" and the other of the source and the drain is referred to as the "other end of the transistor."

Figure 6:
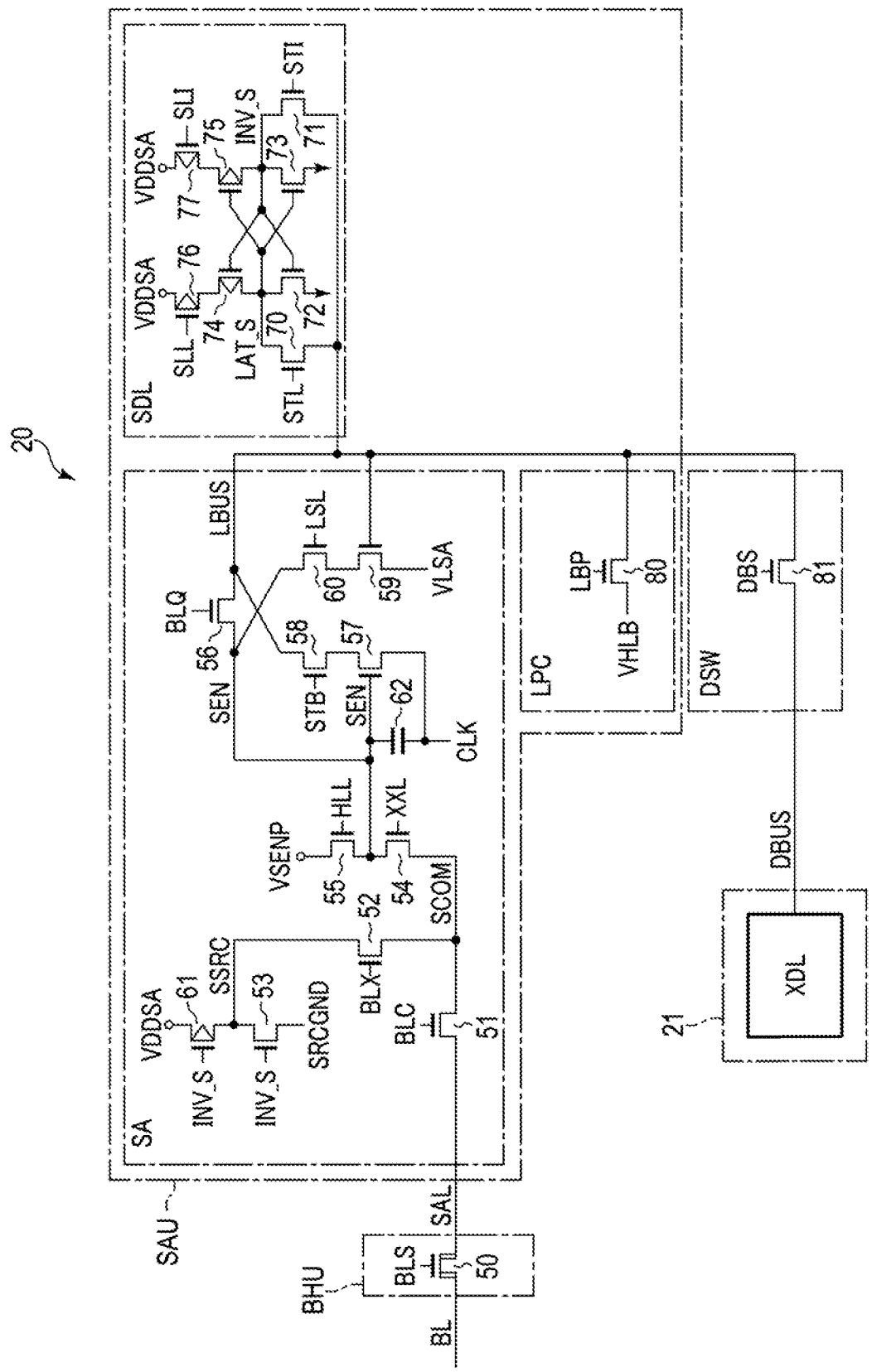
FIG. 6 is a circuit diagram illustrating a sense amplifier provided in the semiconductor storage device according to the first embodiment.

As illustrated in FIG. 6, the sense amplifier unit SAU is connected to the bit line BL via a BL hookup circuit BHU. The sense amplifier unit SAU is connected to the latch circuit XDL in the data register 21 via a DBUS switch circuit DSW.

The BL hookup circuit BHU includes a high breakdown voltage n-channel MOS transistor 50. One end of the transistor 50 is connected to the corresponding bit line BL and the other end of the transistor 50 is connected to the sense amplifier unit SAU via a sense amplifier line SAL. A signal BLS is input to the gate of the transistor 50. The signal BLS is a signal for controlling electric connection between the bit line BL and the sense amplifier unit SAU.

The sense amplifier unit SAU includes a sense circuit SA, a latch circuit SDL, and a precharge circuit LPC.

The sense circuit SA includes low breakdown voltage n-channel MOS transistors 51 to 60, a low breakdown voltage p-channel MOS transistor 61, and a capacitive element 62.

A signal BLC is input to the gate of the transistor 51. One end of the transistor 51 is connected to the sense amplifier line SAL and the other end of the transistor 51 is connected to a node SCOM. The transistor 51 is used to clamp the corresponding bit line BL to a potential, according to the signal BLC.

A signal BLX is input to the gate of the transistor 52. One end of the transistor 52 is connected to the node SCOM and the other end of the transistor 52 is connected to a node SSRC.

The gate of the transistor 53 is connected to a node INV_S. One end of the transistor 53 is connected to the node SSRC and the other end of the transistor 53 is connected to a node SRCGND. For example, a ground voltage VSS is applied to the node SRCGND.

The gate of the transistor 61 is connected to the node INV_S. A supply voltage VDDSA is applied to one end of the transistor 61 and the other end of the transistor 61 is connected to the node SSRC.

A signal XXL is input to the gate of the transistor 54. One end of the transistor 54 is connected to the node SCOM and the other end of the transistor 54 is connected to a node SEN.

A signal HLL is input to the gate of the transistor 55. A voltage VSENP is applied to one end of the transistor 55 and the other end of the transistor 55 is connected to the node SEN.

One electrode of the capacitive element 62 is connected to the node SEN and a clock signal CLK is input to the other electrode of the capacitive element 62.

The gate of the transistor 57 is connected to the node SEN. One end of the transistor 57 is connected to one end of the transistor 58 and the clock signal CLK is input to the other end of the transistor 57. The transistor 57 functions as a sense transistor that senses a voltage of the node SEN.

A signal STB is input to the gate of the transistor 58. The other end of the transistor 58 is connected to a bus LBUS.

A signal BLQ is input to the gate of the transistor 56. One end of the transistor 56 is connected to the node SEN and the other end of the transistor 56 is connected to the bus LBUS. For example, when the node SEN is charged via the bus LBUS, the transistor 56 is considered to be turned on.

The gate of the transistor 59 is connected to the bus LBUS. One end of the transistor 59 is connected to one end of the transistor 60 and a voltage VLSA is applied to the other end of the transistor 59. The voltage VLSA may be, for example, the ground voltage VSS.

A signal LSL is input to the gate of the transistor 60. The other end of the transistor 60 is connected to the node SEN.

At the time of data writing, the sense circuit SA controls the bit line BL according to data retained in the latch circuit SDL.

The latch circuit SDL includes low breakdown voltage n-channel MOS transistors 70 to 73 and low breakdown voltage p-channel MOS transistors 74 to 77.

A signal STL is input to the gate of the transistor 70. One end of the transistor 70 is connected to the bus LBUS and the other end of the transistor 70 is connected to a node LAT_S.

A signal STI is input to the gate of the transistor 71. One end of the transistor 71 is connected to the bus LBUS and the other end of the transistor 71 is connected to a node INV_S.

The gate of the transistor 72 is connected to the node INV_S. One end of the transistor 72 is connected to a ground voltage wiring and the other end of the transistor 72 is connected to the node LAT_S.

The gate of the transistor 73 is connected to the node LAT_S. One end of the transistor 73 is grounded and the other end of the transistor 73 is connected to the node INV_S.

The gate of the transistor 74 is connected to the node INV_S. One end of the transistor 74 is connected to the node LAT_S and the other end of the transistor 74 is connected to one end of the transistor 76.

The gate of the transistor 75 is connected to the node LAT_S. One end of the transistor 75 is connected to the node INV_S and the other end of the transistor 75 is connected to one end of the transistor 77.

A signal SLL is input to the gate of the transistor 76. The supply voltage VDDSA is applied to the other end of the transistor 76.

A signal SLI is input to the gate of the transistor 77. The supply voltage VDDSA is applied to the other end of the transistor 77.

In the latch circuit SDL, a first inverter includes the transistors 72 and 74 and a second inverter includes the transistors 73 and 75. The latch circuit SDL retains data in the node LAT_S and retains inverted data in the node INV_S.

The sense amplifier unit SAU may include a plurality of latch circuits that has the same configuration as the latch circuit SDL as multi-value operation latch circuits in which individual memory cell transistors MT retain data with 2 bits or more. In this case, the latch circuit is connected to the bus LBUS so that data can be transmitted and received.

The precharge circuit LPC precharges the bus LBUS. The precharge circuit LPC includes, for example, a low breakdown voltage n-channel MOS transistor 80. A signal LBP is input to the gate of the transistor 80. One end of the transistor 80 is connected to the bus LBUS and a voltage VHLB is applied to the other end of the transistor 80. The precharge circuit LPC precharges the bus LBUS by transmitting the voltage VHLB to the bus LBUS.

The DBUS switch circuit DSW connects the bus LBUS to the bus DBUS. That is, the DBUS switch circuit DSW connects the sense amplifier unit SAU to the latch circuit XDL in the data register 21. The DBUS switch circuit DSW includes, for example, a low breakdown voltage n-channel MOS transistor 81. A signal DBS is input to the gate of the transistor 81. One end of the transistor 81 is connected to the bus LBUS and the other end of the transistor 81 is connected to the latch circuit XDL in the data register 21 via the bus DBUS.

The various signals in the BL hookup circuit BHU, the sense amplifier unit SAU, the DBUS switch circuit DSW in the foregoing configuration are given by, for example, the sequencer 15.

1.2 Layout of Sense Amplifier and Data Register

Figure 7:
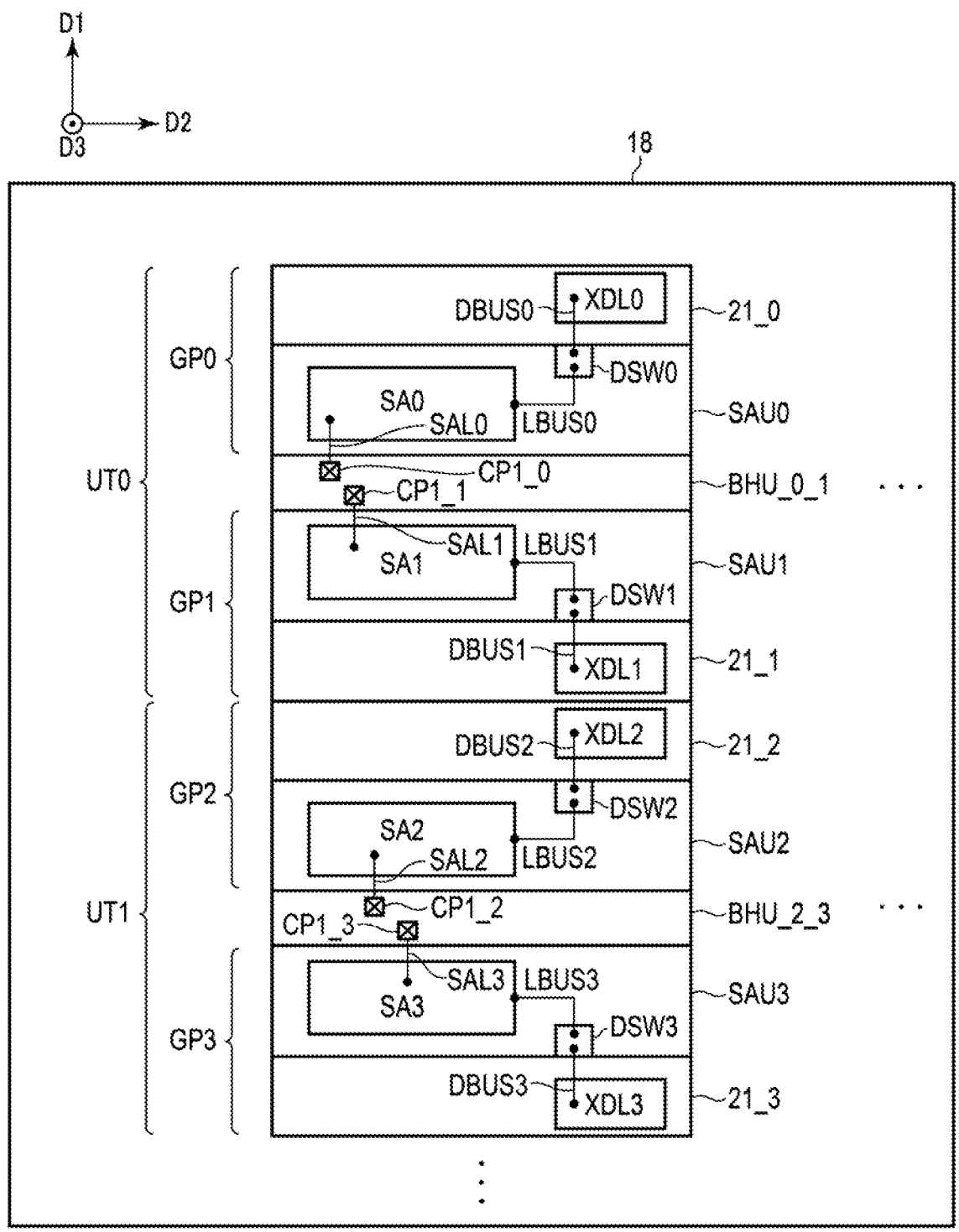
FIG. 7 is a plan view illustrating a BL hookup circuit, the sense amplifier, and a data register provided in the semiconductor storage device according to the first embodiment.

Next, the layout of the sense amplifier 20 and the data register 21 will be described with reference to FIG. 7. In the example of FIG. 7, the BL hookup circuits BHU, the sense amplifier units SAU, and the data registers 21 installed on the semiconductor substrate are illustrated. The memory cell array 18 is installed above the BL hookup circuits BHU, the sense amplifier units SAU, and the data registers 21 via interlayer insulating films.

In the embodiment, a combination of the sense amplifier unit SAU corresponding to one bit line BL and the data register 21 connected to the sense amplifier unit SAU is referred to as a "sense group GP". The BL hookup circuit according to the embodiment corresponds to two bit lines BL. For example, the BL hookup circuit corresponding to the bit lines BL0 and BL1 is referred to as a "BL hookup circuit BHU_0_1". The same applies to the other BL hookup circuits BHU. Further, a combination of one BL hookup circuit BHU and two sense groups GP connected to the BL hookup circuit BHU is referred to as a "hookup unit UT". M (where M is an integer equal to or greater than N/2) hookup units UT (the BL hookup circuits BHU) are installed to correspond to (N−1) bit lines BL. The M hookup units UT are disposed in, for example, a matrix form on the semiconductor substrate.

In the following description, when circuits, wirings, and the like corresponding to the bit lines BL0 to BL(N−1) are distinguished from each other, "numerals corresponding to the bit lines BL" are added to the ends of reference numerals for the description. For example, a sense group GP0, a sense circuit SA0, a sense amplifier line SAL0, a bus LBUS0, a bus DBUS0, a DBUS switch circuit DSW0, a latch circuit XDL0, a transistor 50_0, and a data register 21_0 each correspond to the bit line BL0.

FIG. 7 illustrates the arrangement of the sense amplifier unit SAU and the data register 21 corresponding to each bit line BL. More specifically, the hookup unit UT0 includes, for example, the data register 21_0 and the sense amplifier unit SAU0 of the sense group GP0, the BL hookup circuit BHU_0_1, and the amplifier unit SAU1 and the data register 21_1 of the sense group GP1, which are arranged in sequence along the first direction D1. That is, in the hookup unit UT0, the sense amplifier units SAU0 and SAU1 are located on both sides of the BL hookup circuit BHU_0_1 such that the BL hookup circuit BHU_0_1 is in the middle. In other words, the corresponding BL hookup circuit BHU_0_1 is located between the sense amplifier units SAU0 and SAU1. The data registers 21_0 and 21_1 are located outside of the sense amplifier units SAU0 and SAU1.

The bit line BL0 is connected to a contact plug CP1_0 in the BL hookup circuit BHU_0_1. The contact plug CP1 penetrates through the memory cell array 18 and connects to a wiring installed above the memory cell array 18 and a wiring below the memory cell array 18. The contact plug CP1_0 is connected to the sense circuit SA0 of the sense amplifier unit SAU0 via a transistor 50_0 (not illustrated) and the sense amplifier line SAL0. The sense circuit SA0 of the sense amplifier unit SAU0 is connected to the latch circuit XDL0 of the data register 21_0 via the bus LBUS0, the DBUS switch circuit DSW0, and the bus DBUS0. The bus DBUS is installed in each sense amplifier unit SAU and connects the corresponding DBUS switch circuit DSW to the latch circuit XDL of the data register 21.

The bit line BL1 is connected to the contact plug CP1_1 of the BL hookup circuit BHU_0_1 as in the bit line BL0. The contact plug CP1_1 is connected to the sense circuit SA1 of the sense amplifier unit SAU1 via the transistor 50_1 (not illustrated) and the sense amplifier line SAL1. The sense circuit SA1 of the sense amplifier unit SAU1 is connected to the latch circuit XDL1 of the data register 21_1 via the bus LBUS1, the DBUS switch circuit DSW1, and the bus DBUS1.

The layout of a BL hookup circuit BHU_2_3, the sense amplifier units SAU2 and SAU3, and data registers 21_2 and 21_3 in the hookup unit UT1, is the same as that of the hookup unit UT0.

The bit line BL2 is connected to a contact plug CP1_2 of the BL hookup circuit BHU_2_3. The contact plug CP1_2 is connected to the sense circuit SA2 of the sense amplifier unit SAU2 via the transistor 50_2 (not illustrated) and the sense amplifier line SAL2. The sense circuit SA of the sense amplifier unit SAU2 is connected to the latch circuit XDL2 of the data register 21_2 via the bus LBUS2, the DBUS switch circuit DSW2, and the bus DBUS2.

The bit line BL3 is connected to the contact plug CP1_3 of the BL hookup circuit BHU_2_3. The contact plug CP1_3 is connected to the sense circuit SA3 of the sense amplifier unit SAU3 via the transistor 50_3 (not illustrated) and the sense amplifier line SAL3. The sense circuit SA3 of the sense amplifier unit SAU3 is connected to the latch circuit XDL3 of the data register 21_3 via the bus LBUS3, the DBUS switch circuit DSW3, and the bus DBUS3.

Any two bit lines BL corresponding to one hookup unit UT can be set. For example, the hookup unit UT0 may correspond to the bit lines BL0 and BL2 and the hookup unit UT1 may correspond to the bit lines BL1 and BL3.

Further, any layout of the sense amplifier unit SAU and the data register 21 can be set in the sense group GP. For example, in the case of the hookup unit UT0, the sense amplifier unit SAU0, the data register 21_0, the BL hookup circuit BHU_0_1, the data register 21_1, and the sense amplifier unit SAU1 may be arranged in sequence along the first direction D1.

1.3 Connection of Memory Cell Array and Sense Amplifier

Figure 8:
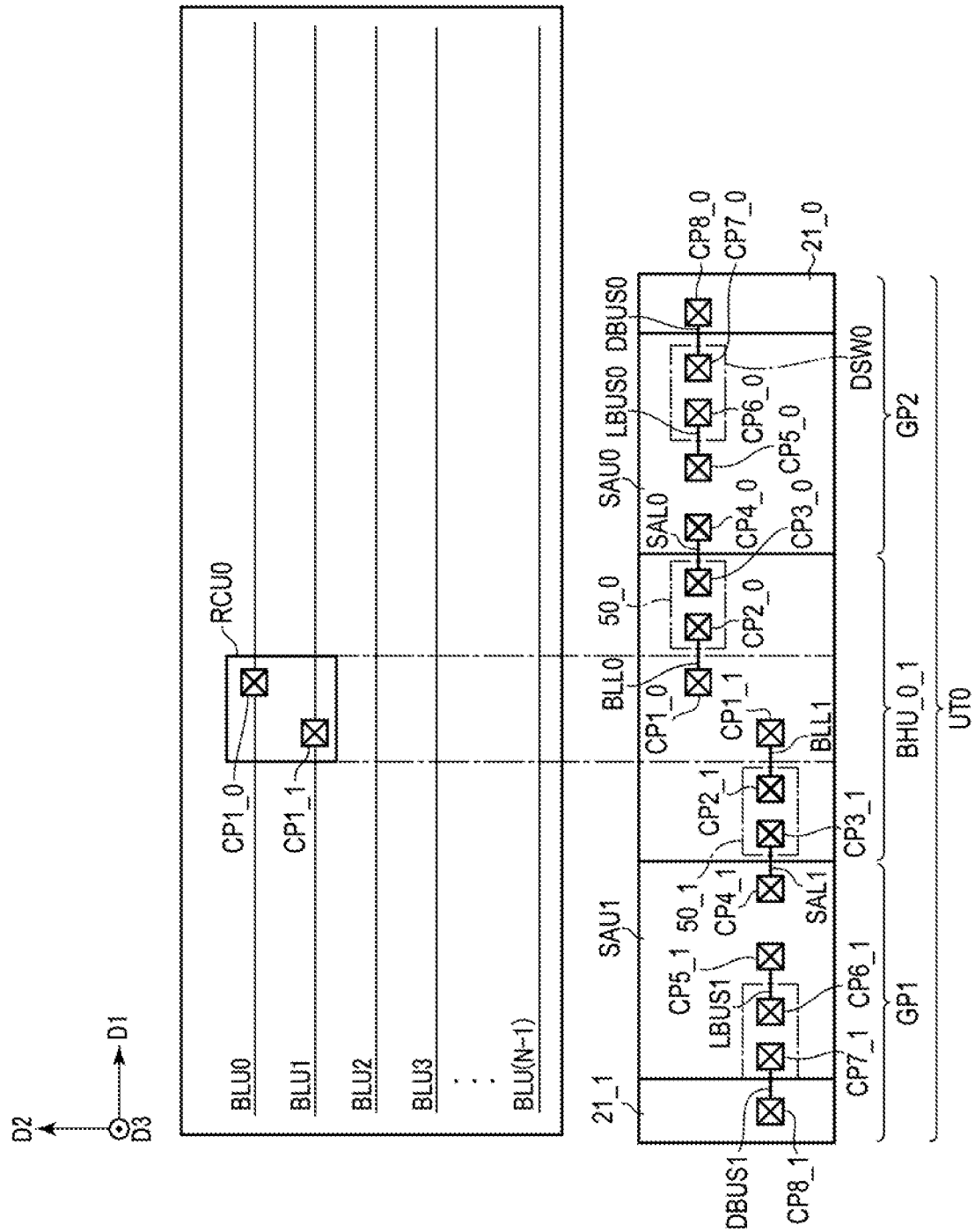
FIG. 8 is a diagram illustrating a planar layout of the semiconductor storage device according to the first embodiment.
Figure 9:
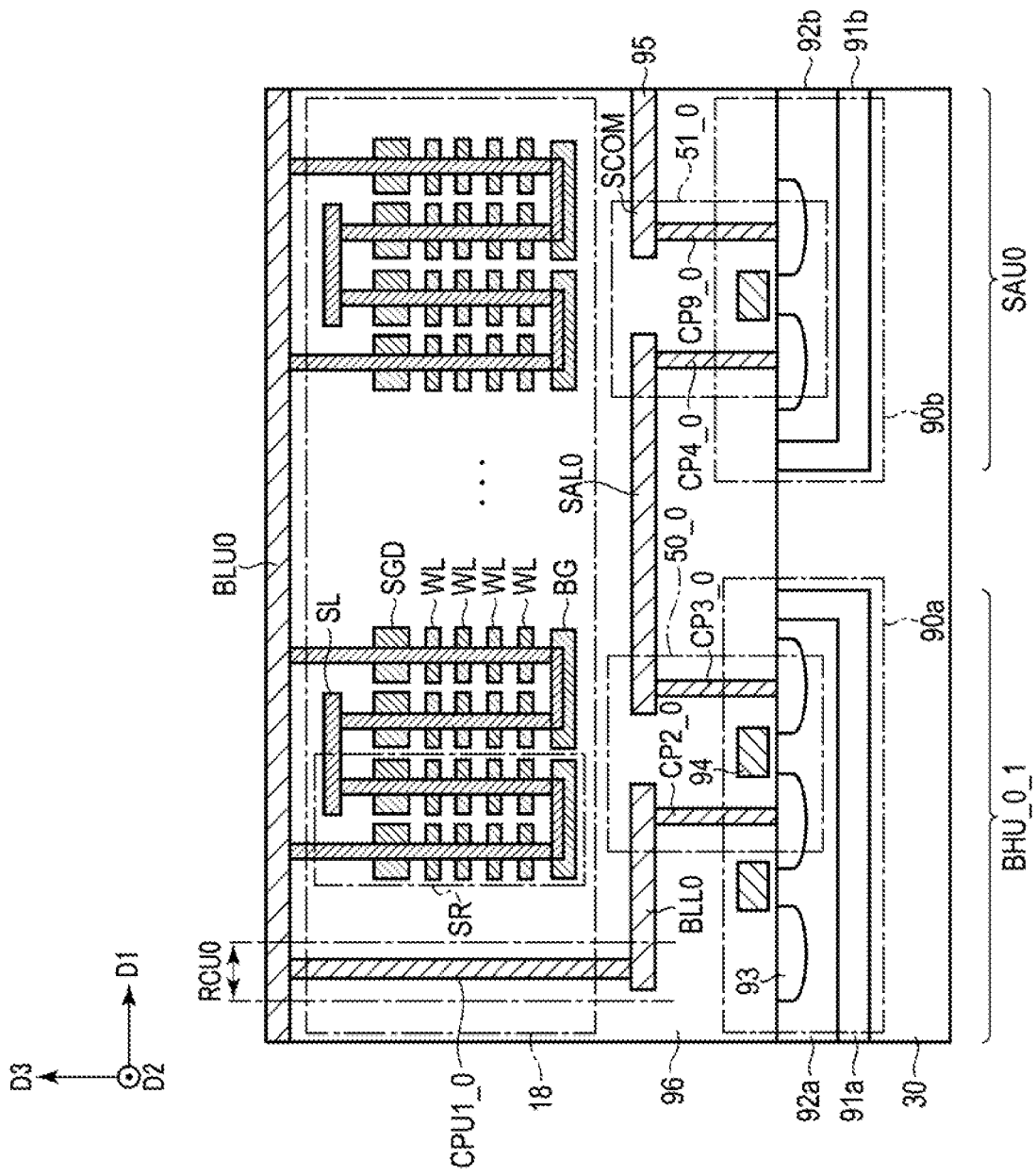
FIG. 9 is a sectional view illustrating a memory cell array, the BL hookup circuit, and the sense amplifier provided in the semiconductor storage device according to the first embodiment.

Next, connection of the memory cell array 18 and the sense amplifier 20 will be described with reference to FIGS. 8 and 9. FIG. 8 is a plan view illustrating a connection relation between the memory cell array 18 and the hookup unit UT0 installed below the memory cell array 18. In FIG. 8, the upper drawing is a plan view of the memory cell array 18 and illustrates the bit line BL installed above the memory cell array 18. The lower drawing is a plan view of the hookup unit UT0 disposed below the memory cell array 18, that is, in the peripheral circuit region PC. FIG. 9 is a sectional view taken in the first direction D1 of FIG. 8 and particularly illustrates a cross-sectional configuration of a portion in which the bit line BL0 is seen.

Hereinafter, the bit line BL installed above the memory cell array 18 is notated as an "upper bit line BLU" and the bit line BL installed below the memory cell array 18 is notated as a "lower bit line BLL". The upper bit line BLU, the lower bit line BLL, and the contact plug CP1 are equivalent to the bit line BL described above. That is, the bit line BL includes the upper bit line BLU, the lower bit line BLL, and the contact plug CP1 connecting both the upper and lower bit lines.

As illustrated in FIG. 8, the upper bit lines BLU (BLU0 to BLU (N−1)) are installed above the memory cell array 18 along the first direction. In the memory cell array 18, M connecting portions RCU are installed to correspond to M hookup units UT. In the example of FIG. 8, the connecting portions RCU0 and RCU1 corresponding to the hookup units UT0 and UT1 are illustrated. In the example of FIG. 8, the contact plugs CP1_0 and CP1_1 are installed in the region of the connecting portion RCU0. The upper bit line BLU0 is connected to the lower bit line BLL0 via the contact plug CP1_0 and the upper bit line BLU1 is connected to the lower bit line BLL1 via the contact plug CP1_1. The contact plugs CP1_0 and CP1_1 in the connecting portion RCU0 can be laid out in an manner as long as the bit lines BL0 and BL1 can be connected. For example, the contact plugs CP1_0 and CP1_1 may be arranged in a different direction from the first direction D1 and the second direction D2, or may be arranged along the second direction D2.

In the region of the BL hookup circuit BHU_0_1, the lower bit line BLL0 is connected to one end of the transistor 50_0 via the contact plug CP2_0. The other end of the transistor 50_0 is connected to the sense amplifier line SAL0 via the contact plug CP3_0.

In the region of the sense amplifier unit SAU0, the sense amplifier line SAL0 is connected to one end of the transistor 50_0 in the sense circuit SA0 via the contact plug CP4_0. The sense circuit SA0 is connected to the bus LBUS0 via the contact plug CP5_0. The bus LBUS0 is connected to one end of the DBUS switch circuit DSW0 via the contact plug CP6_0. The other end of the DBUS switch circuit DSW0 is connected to the bus DBUS0 via the contact plug CP7_0.

In the region of the data register 21_0, the bus DBUS0 is connected to the latch circuit XDL0 via the contact plug CP8_0.

Connection of contact plugs CP2_1, CP3_1, CP4_1, CP5_1, CP6_1, CP7_1, and CP8_1 in the hookup unit UT0 is the same as the connection of the contact plugs CP2_0, CP3_0, CP4_0, CP5_0, CP6_0, CP7_0, and CP8_0.

More specifically, in the region of the BL hookup circuit BHU_0_1, the lower bit line BLL1 is connected to one end of the transistor 50_1 via the contact plug CP2_1. The other end of the transistor 50_1 is connected to the sense amplifier line SAL1 via the contact plug CP3_1.

In the region of the sense amplifier unit SAU1, the sense amplifier line SAL1 is connected to one end of the transistor 50_1 in the sense circuit SA1 via the contact plug CP4_1. The sense circuit SA1 is connected to the bus LBUS1 via the contact plug CP5_1. The bus LBUS1 is connected to one end of the DBUS switch circuit DSW1 via the contact plug CP6_1. The other end of the DBUS switch circuit DSW1 is connected to the bus DBUS1 via the contact plug CP7_1.

In the region of the data register 21_1, the bus DBUS1 is connected to the latch circuit XDL1 via the contact plug CP8_1.

Next, a cross-sectional configuration of the memory cell array 18 and the sense amplifier 20 will be described. In the example of FIG. 9, the transistor 50_0 corresponding to the bit line BL0 and a part of the sense amplifier unit SAU0 in the hookup unit UT0 are illustrated. The other circuits and the like in the hookup unit UT0 are omitted.

As illustrated in FIG. 9, a high breakdown voltage transistor well region 90*a* and a low breakdown voltage well region 90*b* are installed on surface regions of the semiconductor substrate 30. The well region 90*a* includes an n type well 91*a* and a p type well 92*a*. The well region 90*b* includes an n type well 91*b* and a p type well 92*b*. For example, the transistor 50_0 is formed on the p type well 92*a*. For example, the transistor 51_0 is formed on the p type well 92*b*. The transistors 50_0 and 51_0 each include an n+ diffusion layer 93 and a gate electrode 94 functioning as a source and a drain.

One end of the transistor 50_0 is connected to a wiring layer 95, in particular, the lower bit line BLL0, via the contact plug CP2_0. The other end of the transistor 50_0 is connected to the wiring layer 95, in particular, the sense amplifier line SAL0, via the contact plug CP3_0.

One end of the transistor 51_0 is connected to the wiring layer 95, in particular, the sense amplifier line SAL0, via the contact plug CP4_0. The other end of the transistor 51_0 is connected to the wiring layer 95, in particular, a node SCOM in the sense amplifier unit SAU0, via the contact plug CP9_0.

An interlayer insulating film 96 is formed on the semiconductor substrate 30 and the memory cell array 18 is formed above the wiring layer 95 via the interlayer insulating film 96. Specifically, the back-gate line BG, the plurality of word lines WL, and the select gate line SGS or SGD are installed in sequence in the third direction D3. Semiconductor layers serving as a current path of the NAND string SR are formed in a U shape. For example, one end of the NAND string SR is connected to the upper bit line BLU0 and the other end of the NAND string SR is connected to the source line SL.

The upper bit line BLU0 is connected to the lower bit line BLL0 via the contact plug CP1_0 penetrating through the memory cell array 18.

In the embodiment, one wiring layer 95 is located below the memory cell array 18. However, more than two wiring layers may be provided. Further, the contact plug CP1 may be a wiring-shaped line contact.

1.4 Write Operation

Next, a write operation will be described in brief. Hereinafter, a relation between the write operation and the ready/busy signal R/Bn will be described.

When the controller 110 transmits a write command set (which includes the write command, the address ADD, and the write data WD) to the NAND flash memory 100, the controller 110 transmits either a normal write command set or a cache write command set to the NAND flash memory 100.

When the normal write command set is received, the NAND flash memory 100 executes a normal write operation. In the normal write operation, the signal R/Bn is considered to be at the "L" level (busy state) during a period in which the write data WD is written in the memory cell array 18.

On the other hand, when the cache write command set is received, the NAND flash memory 100 executes a cache write operation. Writing in the memory cell transistor MT in response to the cache write command set is the same as the writing in response to the normal write command set, but a period of the "L" level of the signal R/Bn is different. In the cache write operation, the signal R/Bn is considered to be at the "L" level during a period in which the write operation starts and the data register 21 ends transmission of the write data WD to the sense amplifier 20. The data register 21 receives the write data WD from the controller 110 via the input and output circuit 10. Then, the data register 21 transmits the write data WD to the sense amplifier 20 via the bus DBUS. When the transmission of the write data WD from the data register 21 to the sense amplifier 20 ends and the latch circuit XDL in the data register 21 can be used, the NAND flash memory 100 transmits the signal R/Bn with the "H" level (ready state) to the controller 110 even though the write operation on the memory cell array 18 may still be in progress, and enters a state in which a subsequent command can be received.

The cache write operation is disclosed in, for example, U.S. patent application Ser. No. 10/318,167, filed on 13 Dec. 2002 and entitled "SEMICONDUCTOR INTEGRATED CIRCUIT ADAPTED TO OUTPUT PASS/FAIL RESULTS OF INTERNAL OPERATIONS." The entire contents of this patent application is incorporated herein by reference.

1.5 Read Operation

Next, a read operation will be described. The read operation includes page reading and cache reading. Page reading is an operation of reading data from the memory cell transistor MT to the data register 21, that is, the latch circuit XDL. Cache reading is an operation of reading data from the data register 21 to the controller 110.

More specifically, in the page reading, the sense amplifier 20 reads data of the corresponding memory cell transistor MT and stores the data in, for example, the latch circuit SDL. Then, the sense amplifier 20 transmits the read data RD stored in the latch circuit SDL to the latch circuit XDL of the data register 21 via the bus DBUS. In the cache reading, the read data RD stored in the data register 21 is transmitted to the controller 110 via the input and output circuit 10.

1.6 Advantages According to Embodiment

In the configuration according to the embodiment, a processing performance can be improved. Hereinafter, the advantages will be described in detail.

For example, in the page reading, tR denotes a period in which data is transmitted from the memory cell array 18 to the data register 21. Then, the period tR includes a read period t1 in which data is read from the memory cell array 18 to the sense amplifier 20 and a data transmission period t2 from the sense amplifier 20 to the data register 21. For example, when the plurality of sense amplifier units SAU and the plurality of latch circuits XDL are connected to the common bus DBUS, the data is transmitted serially to the plurality of latch circuits XDL (and thus, the data is transmitted a plurality of times), and therefore the data transmission period t2 is lengthened. For example, when the sense amplifier unit SAU is distant from the latch circuit XDL, the bus DBUS is lengthened, and thus wiring resistance and wiring capacitance of the bus DBUS increase. Thus, an RC time constant of the bus DBUS increases. Accordingly, a charge and discharge time of the bus DBUS becomes longer and the data transmission period t2 thus becomes longer. Since a chip area increases, the size of the transistor in the sense amplifier unit SAU or the data register 21 may need to be reduced. For this reason, the charge and discharge time of the bus DBUS may not be shortened and the data transmission period t2 becomes longer.

According to the embodiment, however, the sense amplifier units SAU connected to the BL hookup circuit can be disposed on both sides of the BL hookup circuit BHU. That is, the corresponding BL hookup circuit BHU can be disposed between two sense amplifier units SAU. Further, the corresponding data register 21, that is, the latch circuit XDL, can be disposed to be adjacent to the sense amplifier unit SAU. One sense amplifier unit SAU and one latch circuit XDL can be connected to an exclusive DBUS. Thus, data can be prevented from being transmitted serially to the plurality of latch circuits XDL via one bus DBUS. Since the wiring of the bus DBUS can be shortened, the RC time constant can be reduced and the charge and discharge time of the bus DBUS can be shortened. Accordingly, the data transmission period t2 can be shortened and the processing performance of the semiconductor storage device can be improved.

Further, since the distance between the BL hookup circuit and the sense amplifier unit SAU can be shortened, an increase in the charge and discharge period of the bit line BL can be prevented. Accordingly, an increase in the read period t1 can be prevented and the processing performance of the semiconductor storage device can be improved.

Further, in the write operation, the data transmission period in which the data is transmitted from the data register 21 to the sense amplifier unit SAU can be shortened as in the page reading. Accordingly, the processing performance of the semiconductor storage device can be improved.

2. Second Embodiment

Next, a second embodiment will be described. In the second embodiment, different layout of the sense amplifier 20 and the data register 21 from in the first embodiment will be described. Hereinafter, only differences from the first embodiment will be described.

2.1 Layout of Sense Amplifiers and Data Registers

Figure 10:
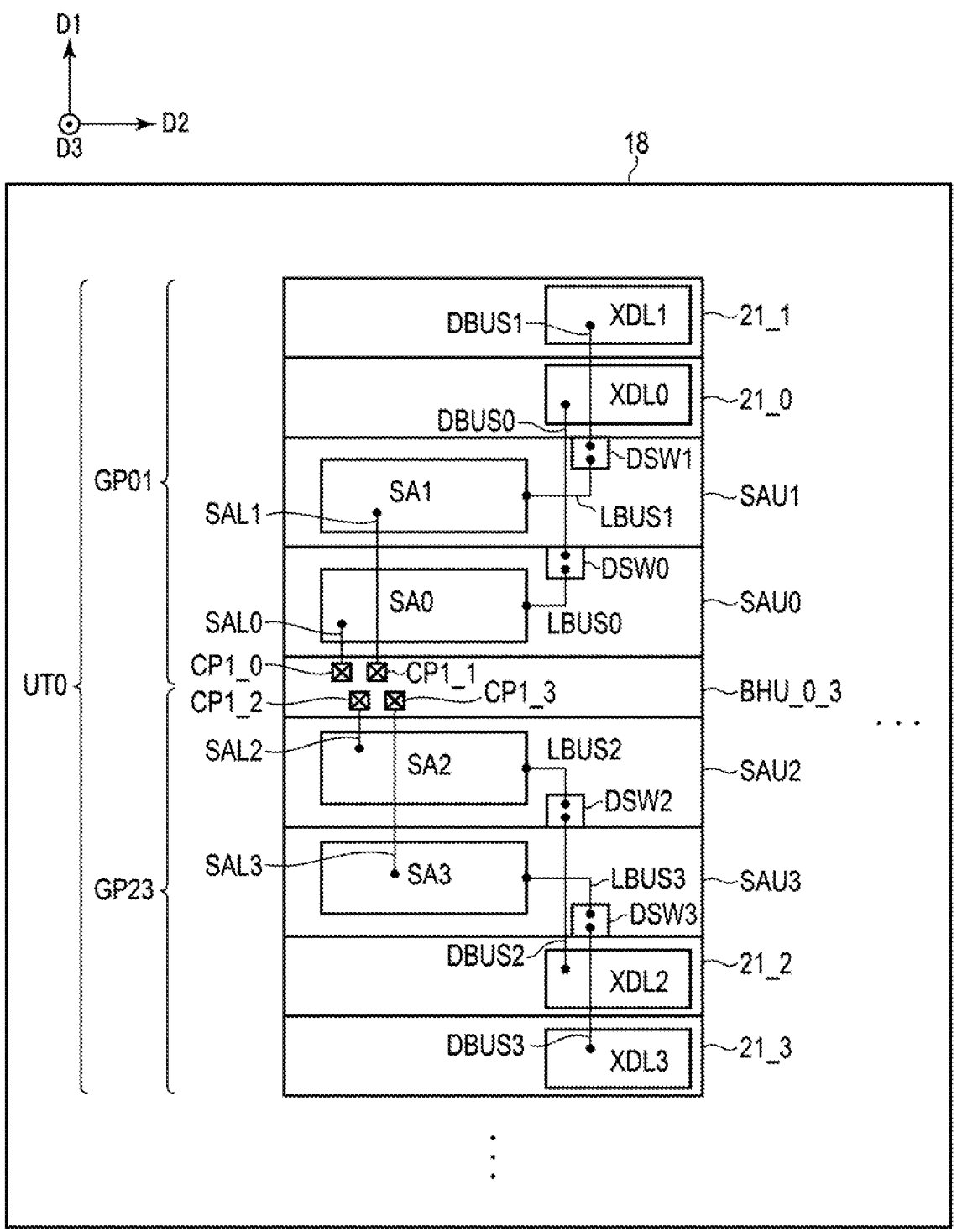
FIG. 10 is a plan view illustrating a BL hookup circuit, a sense amplifier, and a data register provided in a semiconductor storage device according to a second embodiment.

The layout of the sense amplifier 20 and the data register 21 will be described with reference to FIG. 10. In the example of FIG. 10, only the hookup unit UT0 is illustrated to facilitate the description.

In the embodiment, a combination of two sense amplifier units SAU and two data registers 21 corresponding to two bit lines BL is set as one sense group GP. For example, a combination of the sense amplifier units SAU0 and SAU1 and the data registers 21_0 and 21_1 corresponding to the bit lines BL0 and BL1 is set as a sense group GP01. A combination of the sense amplifier units SAU2 and SAU3 and the data registers 21_2 and 21_3 corresponding to the bit lines BL2 and BL3 is set as a sense group GP23. Three or more sense amplifier units SAU and data registers 21 included in one sense group GP may be combined.

As illustrated in FIG. 10, in the hookup unit UT0, the sense group GP01, the BL hookup circuit BHU_0_3 corresponding to the bit lines BL0 to BL3, and the sense group GP23 are arranged in sequence along the first direction D1. More specifically, the data register 21_1, the data register 21_0, the sense amplifier unit SAU1, the sense amplifier unit SAU0, the BL hookup circuit BHU_0_3, the sense amplifier unit SAU2, the sense amplifier unit SAU3, the data register 21_2, and the data register 21_3 are arranged in sequence along the first direction D1. That is, in the hookup unit UT0, two sense amplifier units SAU0 and SAU1 and two sense amplifier units SAU2 and SAU3 are arranged on both side of the BL hookup circuit BHU_0_3 with the BL hookup circuit BHU_0_3 in the middle. In other words, the corresponding BL hookup circuit BHU_0_3 is located between two sense amplifier units SAU0 and SAU1 and two sense amplifier units SAU2 and SAU3. The data registers 21_0 and 21_1 are arranged further to the outside of the two sense amplifier units SAU0 and SAU1 and the data registers 21_2 and 21_3 are arranged further to the outside of the two sense amplifier units SAU2 and SAU3. Any layout of the sense amplifier unit SAU and the data register 21 in the sense group GP can be set. For example, the sense amplifier unit SAU0, the sense amplifier unit SAU1, the BL hookup circuit BHU_0_3, the sense amplifier unit SAU3, and the sense amplifier unit SAU2 may be arranged in sequence along the first direction D1. Alternatively, the sense amplifier unit SAU0, the sense amplifier unit SAU2, the BL hookup circuit BHU_0_3, the sense amplifier unit SAU1, and the sense amplifier unit SAU3 may be arranged in sequence in the first direction D1. The same layout may be applied to the data register 21.

2.2 Advantages According to Embodiment

In the configuration according to the embodiment, the same advantages as those of the first embodiment can be obtained.

Further, according to the embodiment, the BL hookup circuit BHU corresponds to four bit lines BL. Therefore, an increase in a chip area due to an increase in the BL hookup circuit region can be prevented.

3. Third Embodiment

Next, a third embodiment will be described. In the third embodiment, a case in which the region of the BL hookup circuit is not formed will be described. Hereinafter, only differences from the first and second embodiments will be described.

3.1 Layout of Sense Amplifiers and Data Registers

Layout of the sense amplifiers 20 and the data registers 21 will be described with reference to FIG. 11.

In the embodiment, a combination of the sense amplifier unit SAU and the data register 21 corresponding to one bit line BL is set as one sense group GP. In the embodiment, the region of the BL hookup circuit is removed. For example, the transistors 50 provided in the BL hookup circuit BHU in the first and second embodiments may be provided in the sense circuits SA.

Figure 11:
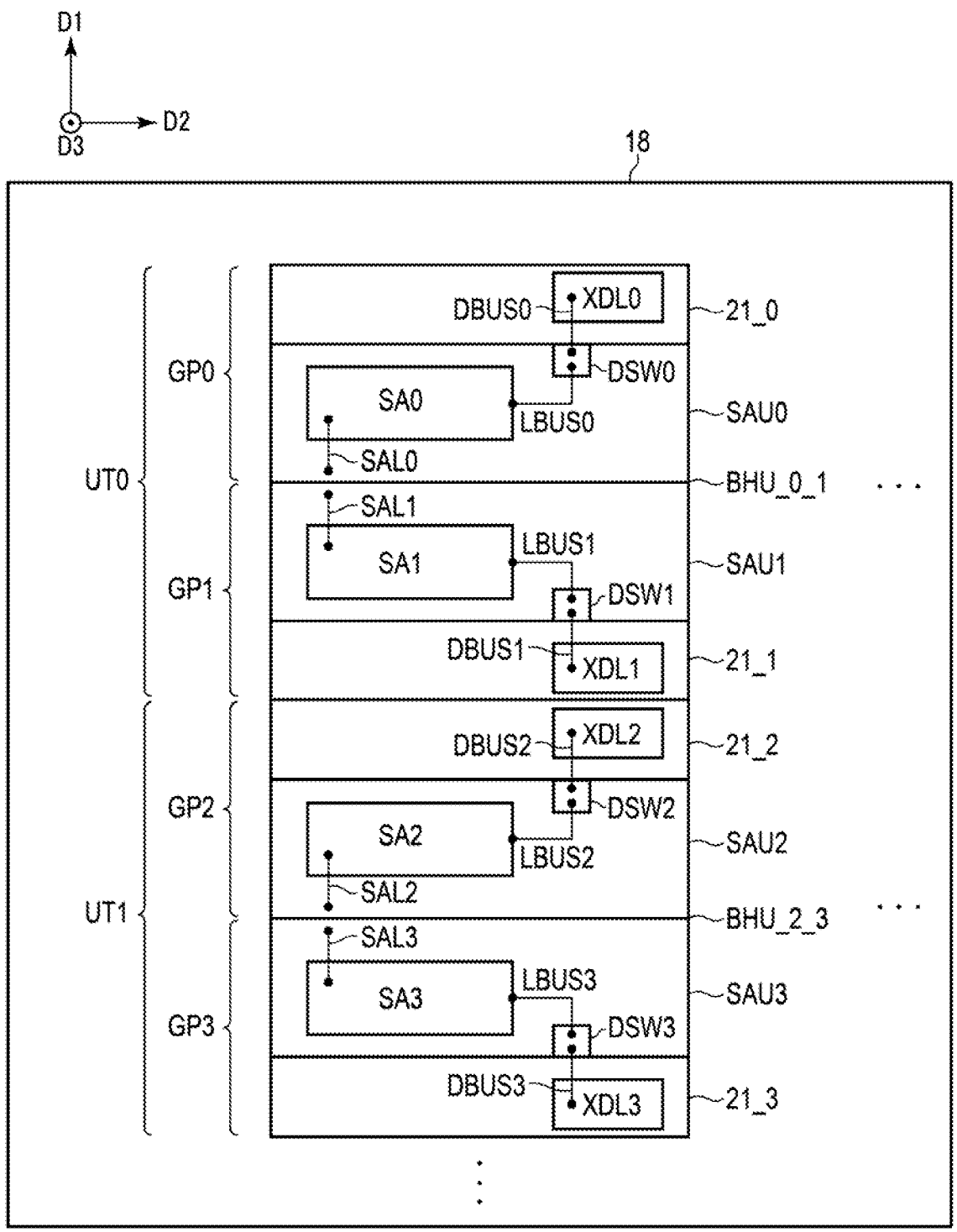
FIG. 11 is a plan view illustrating a BL hookup circuit, a sense amplifier, and a data register provided in a semiconductor storage device according to a third embodiment.

As illustrated in FIG. 11, the hookup unit UT0 includes the sense groups GP0 and GP1 corresponding to the bit lines BL0 and BL1. More specifically, the data register 21_0 and the sense amplifier unit SAU0 of the sense group GP0 and the sense amplifier unit SAU1 and the data register 21_1 of the sense group GP1 are arranged in sequence along the first direction D1. That is, in the hookup unit UT0, the data registers 21_0 and 21_1 are located outside of the two adjacent sense amplifier units SAU0 and SAU1.

As in the hookup unit UT0, the hookup unit UT1 includes the data register 21_2 and the sense amplifier unit SAU2 of the sense group GP2 and the sense amplifier unit SAU3 and the data register 21_3 of the sense group GP3, which are arranged in sequence along the first direction D1.

The number of sense amplifier units SAU and the number of data registers 21 included on one sense group GP may be two or more.

3.2 Advantages According to Embodiment

According to the embodiment, the same advantages as those of the first and second embodiments can be obtained.

4. Fourth Embodiment

Next, a fourth embodiment will be described. In the fourth embodiment, a different configuration of the DBUS switch circuit DSW from that of the first embodiment will be described with 9 examples. Hereinafter, only differences from the first to third embodiments will be described.

4.1 First Example

First, a first example of the fourth embodiment will be described with reference to FIG. 12.

Figure 12:
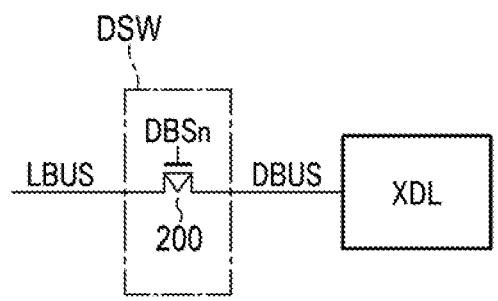
FIG. 12 is a circuit diagram illustrating a DBUS switch circuit provided in a semiconductor storage device according to a first example of a fourth embodiment.

As illustrated in FIG. 12, the DBUS switch circuit DSW includes a low breakdown voltage p-channel MOS transistor 200.

A signal DBSn which is an inverted signal of the signal DBS is input to the gate of the transistor 200. One end of the transistor 200 is connected to the bus LBUS and the other end of the transistor 200 is connected to the bus DBUS.

4.2 Second Example

Next, a second example of the fourth embodiment will be described with reference to FIG. 13.

Figure 13:
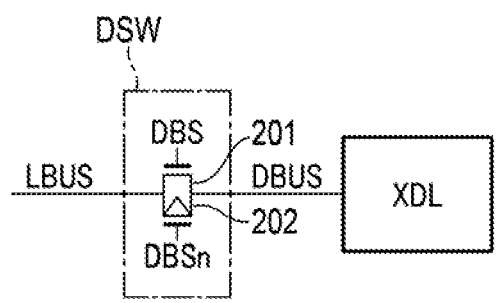
FIG. 13 is a circuit diagram illustrating a DBUS switch circuit provided in a semiconductor storage device according to a second example of the fourth embodiment.

As illustrated in FIG. 13, the DBUS switch circuit DSW includes a low breakdown voltage n-channel MOS transistor 201 and a low breakdown voltage p-channel MOS transistor 202.

The signal DBS is input to the gate of the transistor 201 and the signal DBSn is input to the gate of the transistor 202. One end of each of the transistors 201 and 202 is connected to the bus LBUS and the other end of each of the transistors 201 and 202 is connected to the bus DBUS.

4.3 Third Example

Next, a third example of the fourth embodiment will be described with reference to FIG. 14.

Figure 14:
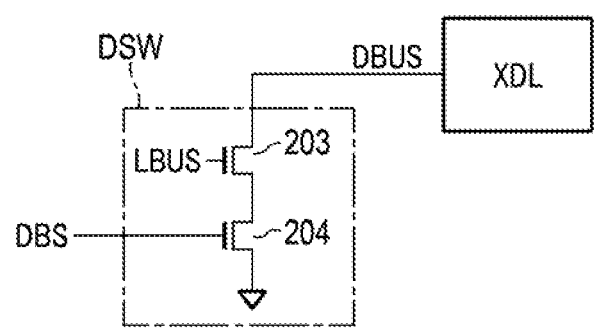
FIG. 14 is a circuit diagram illustrating a DBUS switch circuit provided in a semiconductor storage device according to a third example of the fourth embodiment.

As illustrated in FIG. 14, the DBUS switch circuit DSW includes low breakdown voltage n-channel MOS transistors 203 and 204.

The bus LBUS is connected to the gate of the transistor 203. One end of the transistor 203 is connected to the bus DBUS and the other end of the transistor 203 is connected to one end of the transistor 204. The signal DBS is input to the gate of the transistor 204. The other end of the transistor 204 is grounded.

The DBUS switch circuit DSW discharges the bus DBUS and sets the "L" level when the signal DBS and the bus LBUS are at the "H" level.

4.4 Fourth Example

Next, a fourth example of the fourth embodiment will be described with reference to FIG. 15.

Figure 15:
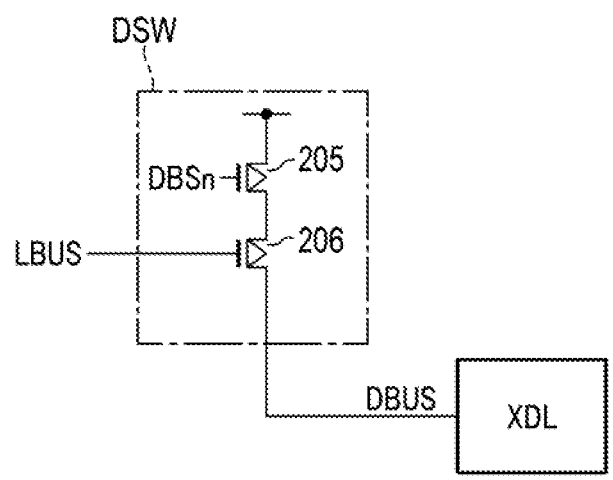
FIG. 15 is a circuit diagram illustrating a DBUS switch circuit provided in a semiconductor storage device according to a fourth example of the fourth embodiment.

As illustrated in FIG. 15, the DBUS switch circuit DSW includes low breakdown voltage p-channel MOS transistors 205 and 206.

The signal DBSn is input to the gate of the transistor 205. A supply voltage is applied to one end of the transistor 205 and the other end of the transistor 205 is connected to one end of the transistor 206. The gate of the transistor 204 is connected to the bus LBUS and the other end of the transistor 204 is connected to the bus DBUS.

The DBUS switch circuit DSW charges the bus DBUS and sets the "H" level when the signal DBSn and the bus LBUS are at the "L" level.

4.5 Fifth Example

Next, a fifth example of the fourth embodiment will be described with reference to FIG. 16.

Figure 16:
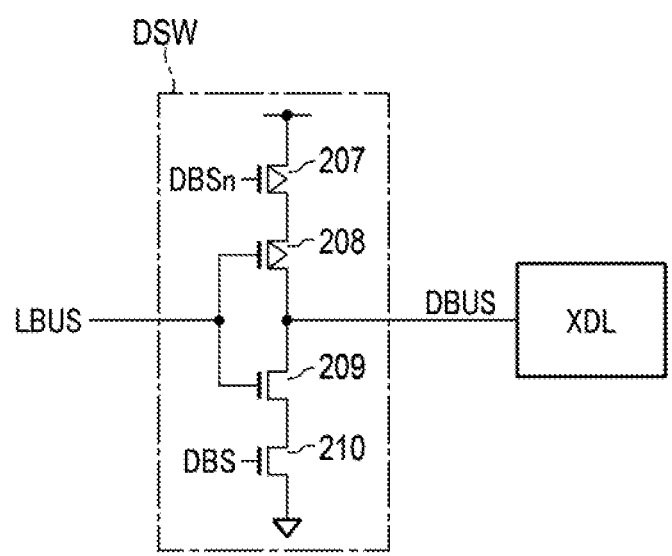
FIG. 16 is a circuit diagram illustrating a DBUS switch circuit provided in a semiconductor storage device according to a fifth example of the fourth embodiment.

As illustrated in FIG. 16, the DBUS switch circuit DSW includes low breakdown voltage p-channel MOS transistors 207 and 208 and low breakdown voltage n-channel MOS transistors 209 and 210.

The signal DBSn is input to the gate of the transistor 207. A supply voltage is applied to one end of the transistor 207. The other end of the transistor 205 is connected to one end of the transistor 208. The bus LBUS is connected to the gates of the transistors 208 and 209. The other end of the transistor 208 and one end of the transistor 209 are connected to the bus DBUS. The other end of the transistor 209 is connected to one end of the transistor 210. The signal DBS is input to the gate of the transistor 210 and the other end of the transistor 210 is grounded. The transistors 208 and 209 function as an inverter.

The DBUS switch circuit DSW transmits an inverted signal of the bus LBUS to the bus DBUS when the signal DBS is at the "H" level (the signal DBSn is at the "L" level).

4.6 Sixth Example

Next, a sixth example of the fourth embodiment will be described with reference to FIG. 17.

Figure 17:
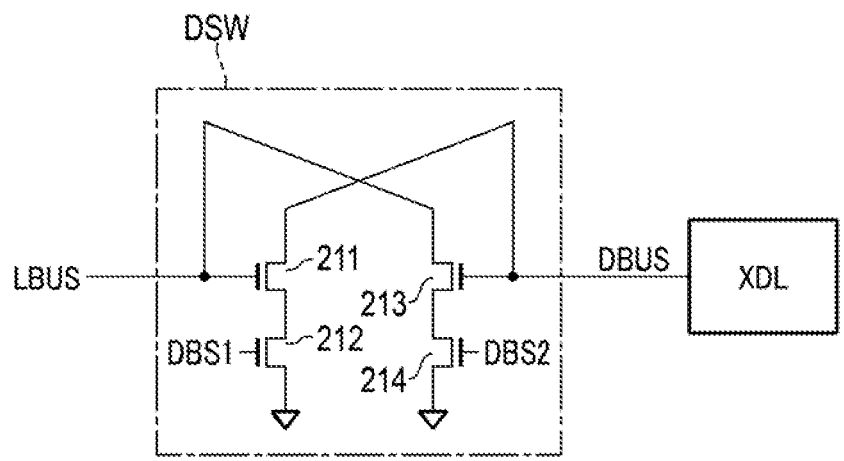
FIG. 17 is a circuit diagram illustrating a DBUS switch circuit provided in a semiconductor storage device according to a sixth example of the fourth embodiment.

As illustrated in FIG. 17, the DBUS switch circuit DSW includes low breakdown voltage n-channel MOS transistors 211 to 214.

The gate of the transistor 211 is connected to the bus LBUS and one end of the transistor 213. One end of the transistor 211 is connected to the gate of the transistor 213 and the bus DBUS. The other end of the transistor 211 is connected to one end of the transistor 212. A signal DBS1 is input to the gate of the transistor 212 and the other end of the transistor 212 is grounded. The other end of the transistor 213 is connected to one end of the transistor 214. A signal DBS2 is input to the gate of the transistor 214 and the other end of the transistor 214 is grounded.

The DBUS switch circuit DSW discharges the bus DBUS and sets the "L" level when the signal DBS1 is at the "H" level and the bus LBUS is considered to be at the "H" level. The DBUS switch circuit DSW discharges the bus LBUS and sets the "L" level when the signal DBS2 is at the "H" level and the bus DBUS is considered to be at the "H" level.

4.7 Seventh Example

Next, a seventh example of the fourth embodiment will be described with reference to FIG. 18.

Figure 18:
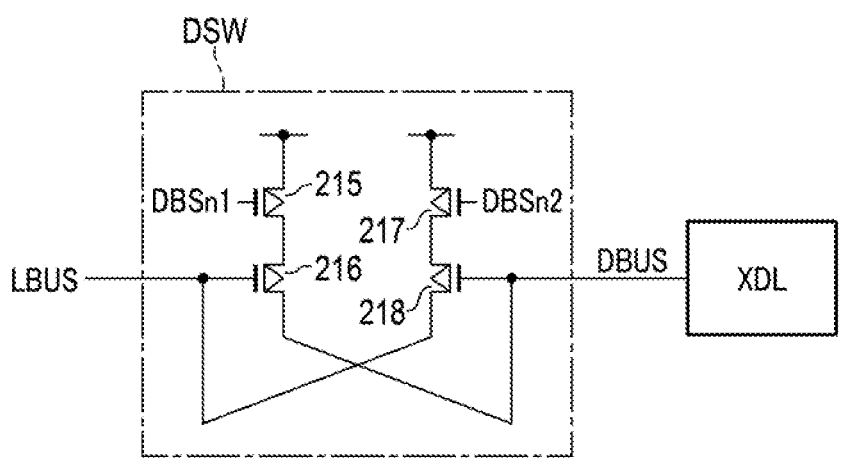
FIG. 18 is a circuit diagram illustrating a DBUS switch circuit provided in a semiconductor storage device according to a seventh example of the fourth embodiment.

As illustrated in FIG. 18, the DBUS switch circuit DSW includes low breakdown voltage p-channel MOS transistors 215 to 218.

A signal DBSn1 is input to the gate of the transistor 215. A supply voltage is applied to one end of the transistor 215 and the other end of the transistor 215 is connected to one end of the transistor 216. A signal DBSn2 is input to the gate of the transistor 217. A supply voltage is applied to one end of the transistor 217 and the other end of the transistor 217 is connected to one end of the transistor 218. The gate of the transistor 216 is connected to the bus LBUS and the other end of the transistor 218. The other end of the transistor 216 is connected to the gate of the transistor 218 and the bus DBUS.

The DBUS switch circuit DSW charges the bus DBUS and sets the "H" level when the signal DBSn1 is at the "L" level and the bus LBUS is considered to be at the "L" level. The DBUS switch circuit DSW charges the bus LBUS and sets the "H" level when the signal DBSn2 is at the "L" level and the bus DBUS is considered to be the "L" level.

4.8 Eighth Example

Next, an eighth example of the fourth embodiment will be described with reference to FIG. 19.

Figure 19:
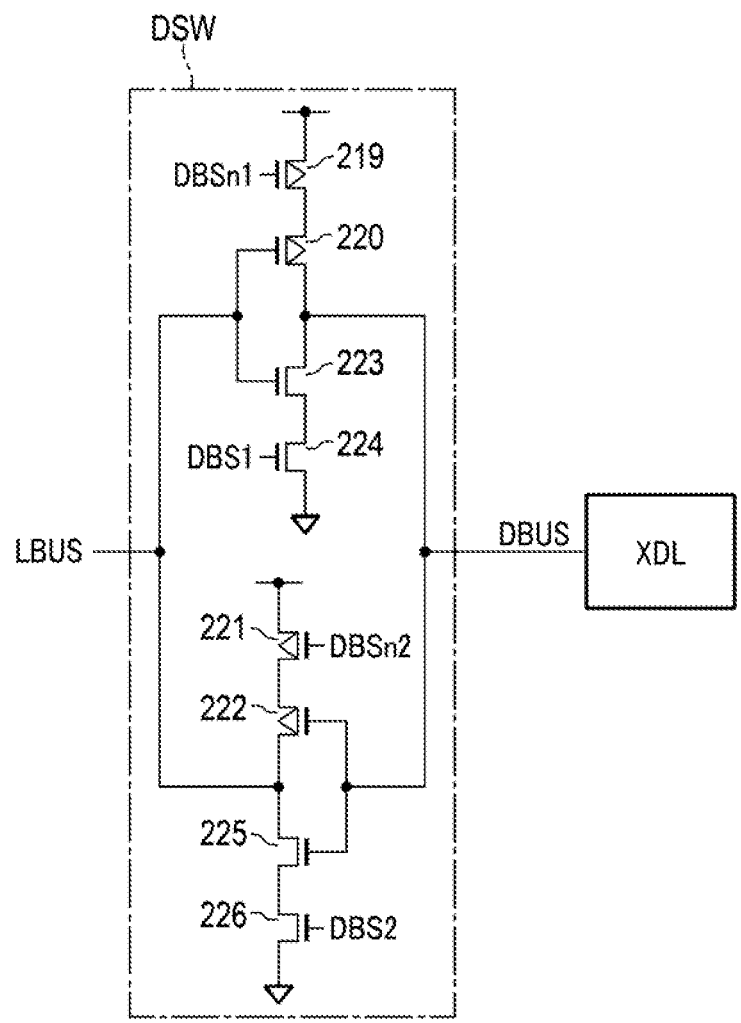
FIG. 19 is a circuit diagram illustrating a DBUS switch circuit provided in a semiconductor storage device according to an eighth example of the fourth embodiment.

As illustrated in FIG. 19, the DBUS switch circuit DSW includes low breakdown voltage p-channel MOS transistors 219 to 222 and low breakdown voltage n-channel MOS transistors 223 to 226.

The signal DBSn1 is input to the gate of the transistor 219. A supply voltage is applied to one end of the transistor 219 and the other end of the transistor 219 is connected to one end of the transistor 220. The bus LBUS is connected to the gates of the transistors 220 and 223. The other end of the transistor 220 and one end of the transistor 223 are connected to the bus DBUS. The other end of the transistor 223 is connected to one end of the transistor 224. The signal DBS1 is input to the gate of the transistor 224 and the other end of the transistor 224 is grounded. The transistors 220 and 223 function as a first inverter.

The signal DBSn2 is input to the gate of the transistor 221. A supply voltage is applied to one end of the transistor 221 and the other end of the transistor 221 is connected to one end of the transistor 222. The bus DBUS is connected to the gates of the transistors 222 and 225. The other end of the transistor 222 and one end of the transistor 225 are connected to the bus LBUS. The other end of the transistor 225 is connected to one end of the transistor 226. The signal DBS2 is input to the gate of the transistor 226 and the other end of the transistor 226 is grounded. The transistors 222 and 225 function as a second inverter.

The DBUS switch circuit DSW transmits an inverted signal of the bus LBUS to the bus DBUS when the signal DBS1 is at the "H" level (the signal DBSn1 is at the "L" level). The DBUS switch circuit DSW transmits an inverted signal of the bus DBUS to the bus LDBUS when the signal DBS2 is at the "H" level (the signal DBSn2 is at the "L" level).

4.9 Ninth Example

Next, a ninth example of the fourth embodiment will be described with reference to FIG. 20.

Figure 20:
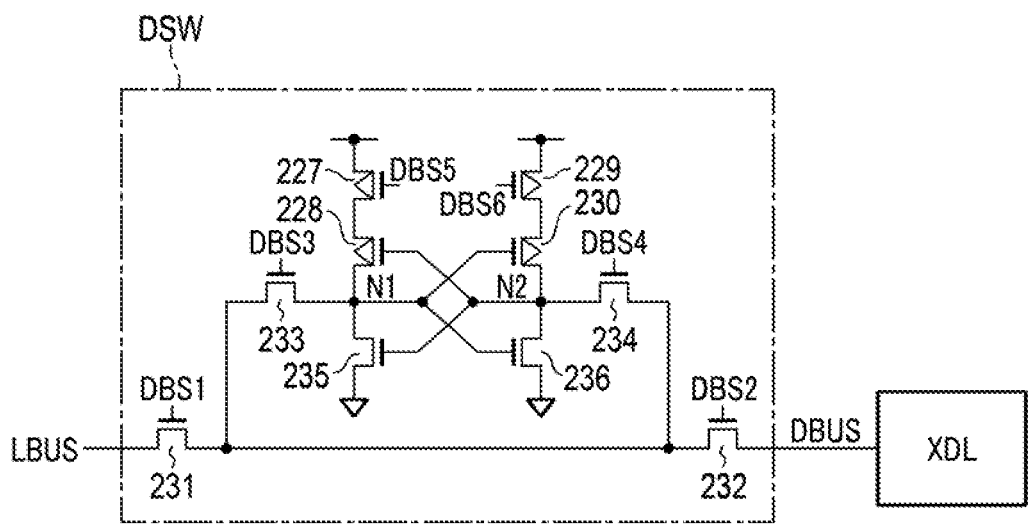
FIG. 20 is a circuit diagram illustrating a DBUS switch circuit provided in a semiconductor storage device according to a ninth example of the fourth embodiment.

As illustrated in FIG. 20, the DBUS switch circuit DSW includes a latch circuit. The DBUS switch circuit DSW includes low breakdown voltage p-channel MOS transistors 227 to 230 and low breakdown voltage n-channel MOS transistors 231 to 236.

The signal DBS1 is input to the gate of the transistor 231 and one end of the transistor 231 is connected to the bus LBUS. The other end of the transistor 231 is connected one end of each of the transistors 232, 233, and 234. The signal DBS2 is input to the gate of the transistor 232 and the other end of the transistor 232 is connected to the bus DBUS. A signal DBS3 is input to the gate of the transistor 233. The other end of the transistor 233 is connected to a node N1. A signal DBS4 is input to the gate of the transistor 234. The other end of the transistor 234 is connected to a node N2.

A signal DBS5 is input to the gate of the transistor 227. A supply voltage is applied to one end of the transistor 227 and the other end of the transistor 227 is connected to one end of the transistor 228. The gate of the transistor 228 is connected to the node N2 and the other end of the transistor 228 is connected to the node N1. The gate of the transistor 235 is connected to the node N2. One end of the transistor 235 is connected to the node N1 and the other end of the transistor 235 is grounded. The transistors 228 and 235 function as the first inverter.

A signal DBS6 is input to the gate of the transistor 229. A supply voltage is applied to one end of the transistor 229 and the other end of the transistor 229 is connected to one end of the transistor 230. The gate of the transistor 230 is connected to the node N1 and the other end of the transistor 230 is connected to the node N2. The gate of the transistor 236 is connected to the node N1. One end of the transistor 236 is connected to the node N2 and the other end of the transistor 236 is grounded. The transistors 230 and 236 function as the second inverter.

The DBUS switch circuit DSW retains the data at the node N1 and retains the inverted data at the node N2. For example, when the data of the bus LBUS is transmitted to the bus DBUS, the signals DBS1 and DBS3 are first considered to be at the "H" level and the data of the bus LBUS is retained at the node N1. Then, when the signal DBS1 is considered to be at the "L" level and the signal DBS2 is considered to be at the "H" level, the data retained at the node N1 is transmitted to the bus DBUS.

The configuration of the latch circuit is not limited to this example. Any configuration may be set as long as the same characteristics can be obtained.

4.10 Advantages According to Embodiment

The configuration according to the embodiment can be applied to the first to third embodiments. Thus, the same advantages as those of the first to third embodiments can be obtained.

5. Modification Examples

The semiconductor storage device according to the foregoing embodiments includes: the hookup circuit (BHU_0_1) that is installed on the semiconductor substrate (30) and includes the first circuit (the transistor 50_0) connected to the first bit line (BL0) and the second circuit (the transistor 50_1) connected to the second bit line (BL1); the first group (GP0) that includes the first sense amplifier circuit (SAU0) connected to the first circuit and the first data register (21_0) connected to the first sense amplifier circuit via the first data bus (DBUS0); the second group (GP1) that includes the second sense amplifier circuit (SAU1) connected to the second circuit and the second data register (21_1) connected to the second sense amplifier circuit via the second data bus (DBUS1); and the memory cell array (18) that is installed above the hookup circuit and the first and second groups via the interlayer insulating film (96) and includes the first memory cell connected to the first bit line and the second memory cell connected to the second bit line. The first group, the hookup circuit, and the second group are disposed in sequence in the first direction parallel to the semiconductor substrate.

By applying the foregoing embodiments, it is possible to provide the semiconductor storage device capable of improving the processing performance.

Embodiments are not limited to the above-described embodiments, but may be modified in various forms.

5.1 First Modification Example

Figure 21:
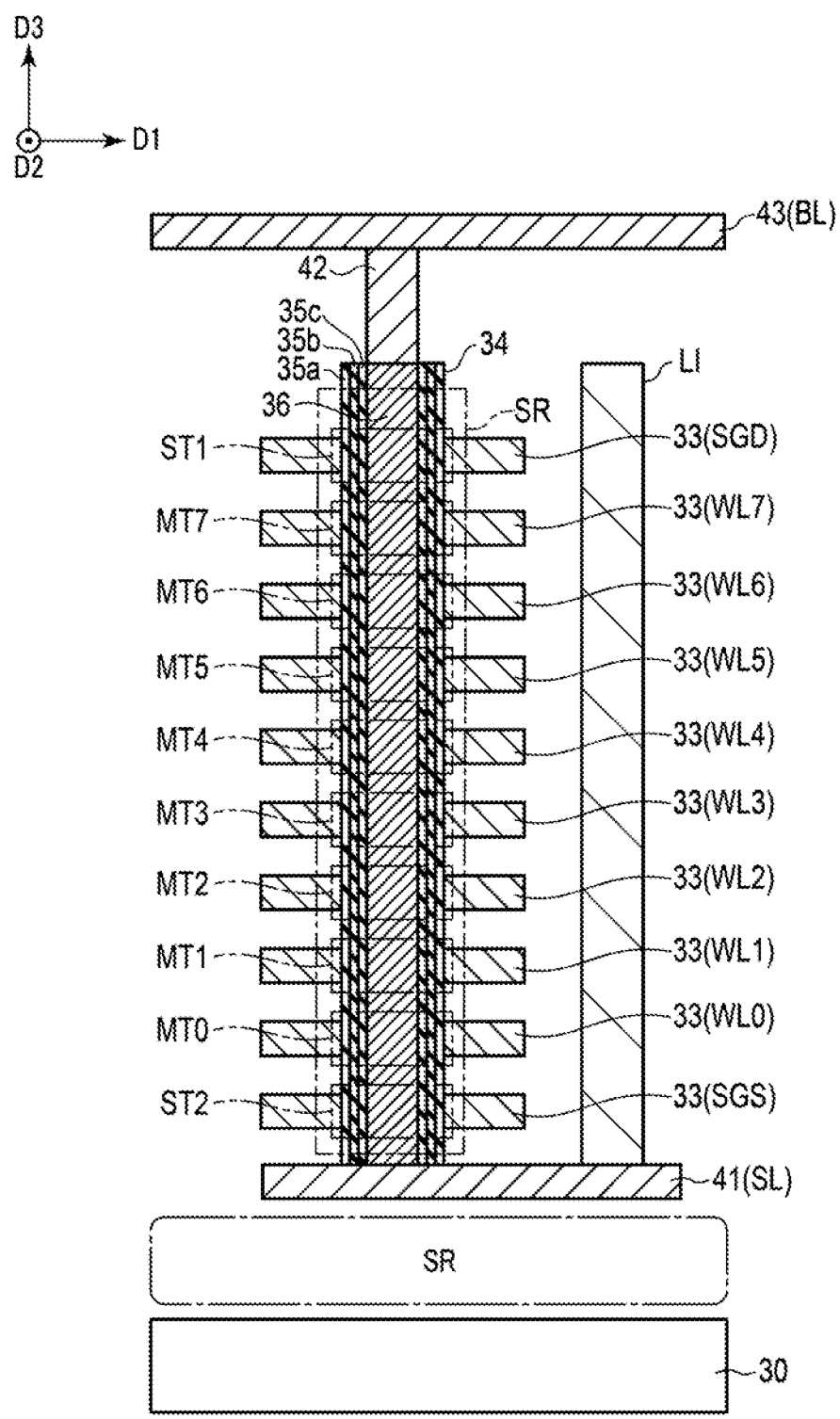
FIG. 21 is a sectional view illustrating a memory cell array provided in a semiconductor storage device according to a first modification example.

For example, in the foregoing embodiments, the NAND string SR may not have the U shape, but may have one columnar shape. An example of the NAND string SR will be described with reference to FIG. 21. In the example of FIG. 21, an interlayer insulating film is omitted.

As illustrated in FIG. 21, the NAND string SR is installed above the peripheral circuit region PC installed on the semiconductor substrate 30. More specifically, the source line layer 41 functioning as the source line SL is installed via an interlayer insulating film above the peripheral circuit region PC. Ten wiring layers 33 that function as the select gate line SGS, the word lines WL0 to WL7 connected to the memory cell transistors MT0 to MT7, and the select gate line SGD are stacked in sequence via interlayer insulating films above the source line layer 41.

A pillar-shaped semiconductor layer 36 penetrating through the ten wiring layers 33 to reach the wiring layer 44 is formed. The tunnel insulating layer 35$c$, the charge storage layer 35$b$, and the block insulating layer 35$a$ are formed in sequence on a side surface of the semiconductor layer 36. The semiconductor layer 36 functions as a current path of the NAND string SR and is a region in which a channel of each transistor is formed. The upper end of the semiconductor layer 36 is connected to the bit line layer 43 extending in the first direction D1 via the plug layer 42. The bit line layer 43 functions as the bit line BL. A source line contact LI extending in the second direction D2 is installed to come into contact with the source line layer 41. The source line contact LI has, for example, a line shape in the second direction D2. For example, one string unit SU is disposed between the two source line contacts LI. For example, polycrystalline silicon is used for the source line contact LI.

5.2 Other Modification Examples

For example, the configurations of the DBUS switch circuits DSW described in the first embodiment and the examples of the fourth embodiment may be combined as much as possible.

Further, the bus DBUS may be segmented using, for example, a switch circuit such as the DBUS switch circuit DSW.

Further, the "connection" in the foregoing embodiments also includes indirect connection of portions made with another portion such as a transistor or a resistor interposed therebetween.

In each embodiment of the present disclosure, the following may be realized. For example, the memory cell transistor MT can retain 2-bit (4-value) data and threshold levels at the time of retaining any of 4 values are set to an Er level (erasure level), an A level, a B level, and a C level from the lower level.

(1) In a read operation, at this time, a voltage to be applied to a word line selected in the read operation with the A level is in a range of, for example, 0 V to 0.55 V. The voltage is not limited thereto, but may be in any of the ranges of 0.1 V to 0.24 V, 0.21 V to 0.31 V, 0.31 V to 0.4 V, 0.4 V to 0.5 V, and 0.5 V to 0.55 V.

A voltage to be applied to a word line selected in a read operation with the B level is in a range of, for example, 1.5 V to 2.3 V. The voltage is not limited thereto, but may be in any of the ranges of 1.65 V to 1.8 V, 1.8 V to 1.95 V, 1.95 V to 2.1 V, and 2.1 V to 2.3 V.

A voltage to be applied to a word line selected in a read operation with the C level is in a range of, for example, 3.0 V to 4.0 V. The voltage is not limited thereto, but may be in any of the ranges of 3.0 V to 3.2 V, 3.2 V to 3.4 V, 3.4 V to 3.5 V, 3.5 V to 3.6 V, and 3.6 V to 4.0 V.

A time (tR) of the read operation may be set between, for example, 25 μs to 38 μs, 38 μs to 70 μs, or 70 μs to 80 μs.

(2) A write operation includes a program operation and a verification operation, as described above. In the write operation, a voltage to be initially applied to a word line selected in the program operation is in a range of, for example, 13.7 V to 14.3 V. The voltage is not limited thereto, but may be in any of the ranges of, for example, 13.7 V to 14.0 V and 14.0 V to 14.6 V.

A voltage to be initially applied to a selected word line at the time of writing an odd word line and a voltage to be initially applied to a selected word line at the time of writing an even word line may be changed.

When the program operation is set to an incremental step pulse program (ISPP) scheme, for example, about 0.5 V can be exemplified as a step-up voltage.

A voltage to be applied to a word line at the time of non-selection may be in a range of, for example, 6.0 V to 7.3 V. The voltage is not limited to this case, but may be in a range of, for example, 7.3 V to 8.4 V or may be 6.0 V or less.

A pass voltage to be applied may be changed according to whether a word line at the time of non-selection is an odd word line or an even word line.

A time (tProg) of the write operation may be in a range of, for example, 1700 μs to 1800 μs, 1800 μs to 1900 μs, or 1900 μs to 2000 μs.

(3) In an erasing operation, a voltage to be initially applied to a well formed in an upper portion of a semiconductor substrate and disposed above the memory cell is in a range of, for example, 12 V to 13.6 V. The voltage is not limited to this case, but may be in a range of, for example, 13.6 V to 14.8 V, 14.8 V to 19.0 V, 19.0 V to 19.8 V, or 19.8 V to 21 V.

A time (tErase) of the erasing operation may be in a range of, for example, 3000 μs to 4000 μs, 4000 μs to 5000 μs, or 4000 μs to 9000 μs.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a semiconductor substrate;
   a plurality of word lines each extending in a first direction and a second direction, and being stacked in a third direction, wherein the first direction, the second direction, and the third direction cross one another, and the third direction is perpendicular to a surface of the semiconductor substrate;
   a memory cell array above the semiconductor substrate and including:
      first and second memory strings each including a plurality of memory cells that are connected to the word lines, respectively, and
      a source line wiring layer between the semiconductor substrate and each of the first and second memory strings in the third direction,
   a first bit line above the memory cell array, extending in the first direction, and connected to the first memory string;
   a second bit line above the memory cell array, extending in the first direction, and connected to the second memory string;
   a hookup circuit between the semiconductor substrate and the memory cell array in the third direction, and includes
      a first wiring connected to the first bit line and extending in the third direction to a location that is at a lower level than the memory cell array,
      a first circuit connected to the first wiring,
      a second wiring connected to the second bit line and extending in the third direction to a location that is at a lower level than the memory cell array, and
      a second circuit connected to the second wiring;
   a first circuit group that includes a first sense amplifier circuit connected to the first circuit and a first data register connected to the first sense amplifier circuit via a first data bus; and
   a second circuit group that includes a second sense amplifier circuit connected to the second circuit and a second data register connected to the second sense amplifier circuit via a second data bus
   wherein the first data register, the first sense amplifier circuit, the hookup circuit, the second sense amplifier circuit, and the second data register are arranged in sequence along the first direction.

2. The semiconductor storage device according to claim 1, wherein
   a distance between the first sense amplifier circuit and the hookup circuit in the first direction and a distance between the second sense amplifier circuit and the hookup circuit in the first direction are the same, and
a distance between the first data register and the hookup circuit in the first direction and a distance between the second data register and the hookup circuit in the first direction are the same.

3. The semiconductor storage device according to claim 1, further comprising:
a first switch circuit that connects the first sense amplifier circuit to the first data bus; and
a second switch circuit that connects the second sense amplifier circuit to the second data bus.

4. The semiconductor storage device according to claim 1, further comprising:
a first lower bit line below the memory cell array, extending in the first direction, and connected to the first bit line via the first wiring, and
a second lower bit line below the memory cell array, extending in the first direction, and connected to the second bit line via the second wiring.

5. The semiconductor storage device according to claim 4, wherein the first wiring and the second wiring are not aligned with each other when viewed along the second direction.

6. A semiconductor storage device comprising:
a semiconductor substrate;
a plurality of word lines each extending in a first direction and a second direction, and being stacked in a third direction, wherein the first direction, the second direction, and the third direction cross one another, and the third direction is perpendicular to a surface of the semiconductor substrate;
a memory cell array above the semiconductor substrate and including:
first, second, third, and fourth memory strings each including a plurality of memory cells that are connected to the word lines, respectively, and
a source line wiring layer between the semiconductor substrate and each of the first, second, third, and fourth memory strings in the third direction,
a first bit line above the memory cell array, extending in the first direction, and connected to the first memory string;
a second bit line above the memory cell array, extending in the first direction, and connected to the second memory string;
a third bit line above the memory cell array, extending in the first direction, and connected to the third memory string;
a fourth bit line above the memory cell array, extending in the first direction, and connected to the fourth memory string;
a hookup circuit between the semiconductor substrate and the memory cell array in the third direction, and includes
first, second, third, and fourth wirings connected respectively to the first, second, third, and fourth bit lines and extending in the third direction to locations that are at a lower level than the memory cell array, and
first, second, third, and fourth circuits connected respectively to the first, second, third, and fourth wirings;
a first circuit group that includes a first sense amplifier circuit connected to the first circuit, a first data register connected to the first sense amplifier circuit via a first data bus, a second sense amplifier circuit connected to the second circuit, and a second data register connected to the second sense amplifier circuit via a second data bus; and
a second circuit group that includes a third sense amplifier circuit connected to the third circuit, a third data register connected to the third sense amplifier circuit via a third data bus, a fourth sense amplifier circuit connected to the fourth circuit, and a fourth data register connected to the fourth sense amplifier circuit via a fourth data bus
wherein the second data register, the first data register, the second sense amplifier circuit, the first sense amplifier circuit, the hookup circuit, the third sense amplifier circuit, the fourth sense amplifier circuit, the third data register, and the fourth data register are arranged in sequence along the first direction.

7. The semiconductor storage device according to claim 6, wherein
a distance between the first sense amplifier circuit and the hookup circuit in the first direction and a distance between the third sense amplifier circuit and the hookup circuit in the first direction are the same, and
a distance between the second sense amplifier circuit and the hookup circuit in the first direction and a distance between the fourth sense amplifier circuit and the hookup circuit in the first direction are the same,
a distance between the first data register and the hookup circuit in the first direction and a distance between the third data register and the hookup circuit in the first direction are the same, and a distance between the second data register and the hookup circuit in the first direction and a distance between the fourth data register and the hookup circuit in the first direction are the same.

8. The semiconductor storage device according to claim 6, further comprising:
a first switch circuit that connects the first sense amplifier circuit to the first data bus;
a second switch circuit that connects the second sense amplifier circuit to the second data bus;
a third switch circuit that connects the first sense amplifier circuit to the third data bus; and
a fourth switch circuit that connects the second sense amplifier circuit to the fourth data bus.

9. The semiconductor storage device according to claim 6, further comprising first, second, third, and fourth lower bit lines below the memory cell array, extending in the first direction, and connected respectively to the first, second, third, and fourth bit lines via the first, second, third, and fourth wirings, respectively.

10. The semiconductor storage device according to claim 9, wherein the first and third wirings are not aligned when viewed in the second direction, and the second and fourth wirings are not aligned when viewed in the second direction.

11. The semiconductor storage device according to claim 6, wherein the third bit line is between the first and second bit lines, and the second bit line is between the third and fourth bit lines.

* * * * *